United States Patent
Yokoi et al.

(10) Patent No.: US 7,307,879 B2
(45) Date of Patent: Dec. 11, 2007

(54) NONVOLATILE MEMORY DEVICE, AND ITS MANUFACTURING METHOD

(75) Inventors: Atsushi Yokoi, Kasugai (JP); Masao Nakano, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/291,048

(22) Filed: Nov. 29, 2005

(65) Prior Publication Data

US 2006/0114722 A1   Jun. 1, 2006

Related U.S. Application Data

(63) Continuation of application No. PCT/JP2004/017751, filed on Nov. 30, 2004.

(51) Int. Cl.
*G11C 16/04* (2006.01)
*H01L 29/788* (2006.01)
*H01L 29/792* (2006.01)

(52) U.S. Cl. ............... 365/185.03; 365/185.05; 365/185.11; 365/185.17; 257/315; 257/316; 257/324

(58) Field of Classification Search .......... 365/185.03, 365/185.11, 185.17; 257/315, 316, 324
See application file for complete search history.

(56) References Cited

U.S. PATENT DOCUMENTS

| | | | |
|---|---|---|---|
| 4,460,980 A | 7/1984 | Hagiwara et al. | |
| 5,498,888 A | 3/1996 | Ozawa | |
| 6,768,681 B2 * | 7/2004 | Kim | 365/185.28 |
| 6,803,620 B2 | 10/2004 | Moriya et al. | |
| 6,885,585 B2 * | 4/2005 | Maayan et al. | 365/185.17 |
| 6,903,405 B2 | 6/2005 | Takahashi | |
| 6,914,815 B2 * | 7/2005 | Kamei et al. | 365/185.11 |
| 6,949,788 B2 | 9/2005 | Fujiwara et al. | |
| 7,075,144 B2 * | 7/2006 | Kim | 257/324 |
| 2002/0196665 A1 * | 12/2002 | Kim | 365/185.22 |
| 2003/0155607 A1 | 8/2003 | Kamigaki et al. | |
| 2004/0196720 A1 * | 10/2004 | Hung et al. | 365/222 |
| 2006/0007732 A1 | 1/2006 | Yeh | |
| 2006/0007735 A1 | 1/2006 | Yeh | |
| 2006/0007741 A1 | 1/2006 | Yeh | |

(Continued)

FOREIGN PATENT DOCUMENTS

JP   54-057875   5/1979

(Continued)

*Primary Examiner*—Ly Duy Pham
(74) *Attorney, Agent, or Firm*—Ingrassia Fisher & Lorenz, P.C.

(57) ABSTRACT

On a channel region enclosed by a pair of diffusion layers 13A, 13B, a first insulating layer 15, a charge accumulative layer 17, and a second insulating layer 19 are stacked up in this order, and on the second insulating layer 19, two control gate layers 21A, 21B spaced across a gap G1 are disposed in the middle of the channel width direction. The charge accumulative layer 17 has discrete charge traps, and, accordingly, movement of charge in the layer is limited. In the charge accumulative layer 17, the charges injected depend on the writing voltage applied in control gate layers 21A, 21B and can be localized beneath the control gate layers 21A, 21B through which a writing voltage is applied. The presence or absence of charges can be controlled in every charge accumulative region beneath the control gate layers 21A, 21B, so that multi-value storage in the memory cell can be realized.

25 Claims, 24 Drawing Sheets

U.S. PATENT DOCUMENTS

| | | |
|---|---|---|
| 2006/0007742 A1 | 1/2006 | Yeh |
| 2006/0008983 A1 | 1/2006 | Yeh |
| 2006/0145243 A1* | 7/2006 | Wong et al. ............... 257/316 |

FOREIGN PATENT DOCUMENTS

| | | |
|---|---|---|
| JP | 04-253375 A | 9/1992 |
| JP | 5-082793 A | 4/1993 |
| JP | 06-104447 A | 4/1994 |
| JP | 06-275790 A | 9/1994 |
| JP | 2000-138300 | 5/2000 |
| JP | 2000-150862 A | 5/2000 |
| JP | 2001-024074 A | 1/2001 |
| JP | 2001-156275 | 6/2001 |
| JP | 2001-237330 | 8/2001 |
| JP | 2002-050703 | 2/2002 |
| JP | 2002-203918 | 7/2002 |
| JP | 2003-059279 A | 2/2003 |
| JP | 2003-176003 | 6/2003 |
| JP | 2003-203998 | 7/2003 |
| JP | 2003-282741 | 10/2003 |
| JP | 2004-327937 | 11/2004 |

* cited by examiner

FIG.15
(LAYOUT DIAGRAM)
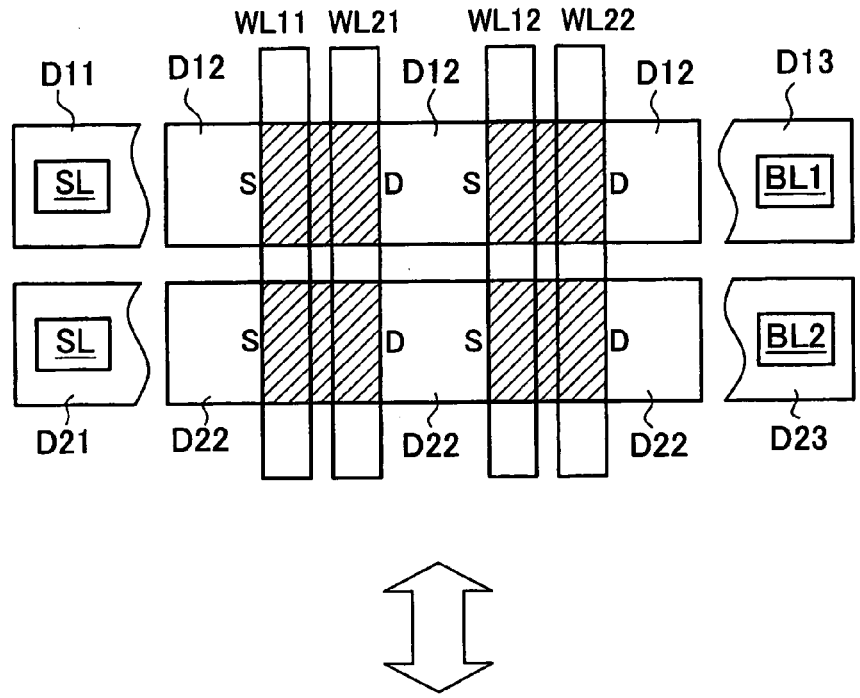
(EQUIVALENT CIRCUIT)
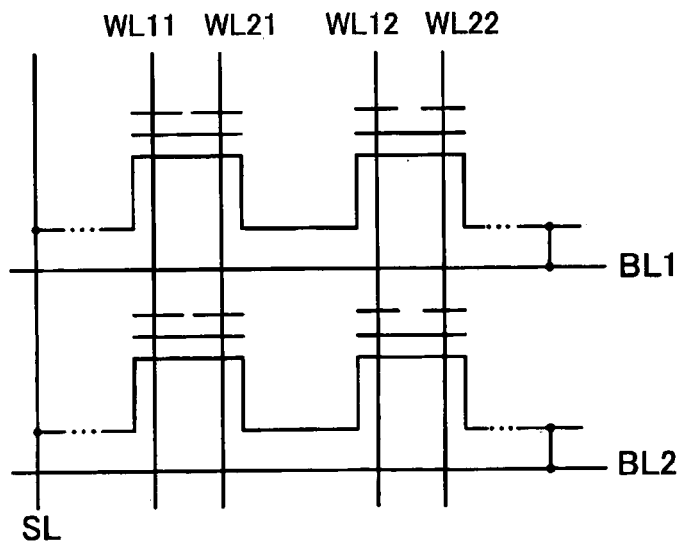

FIG.16
(LAYOUT DIAGRAM)
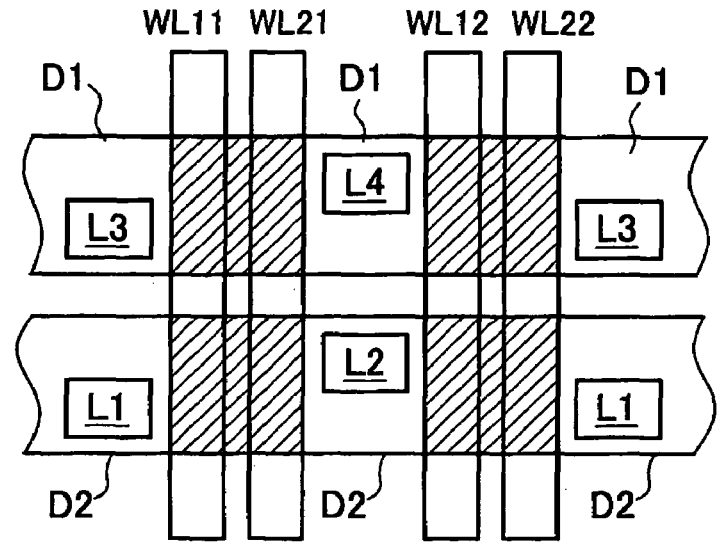
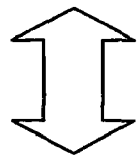
(EQUIVALENT CIRCUIT)
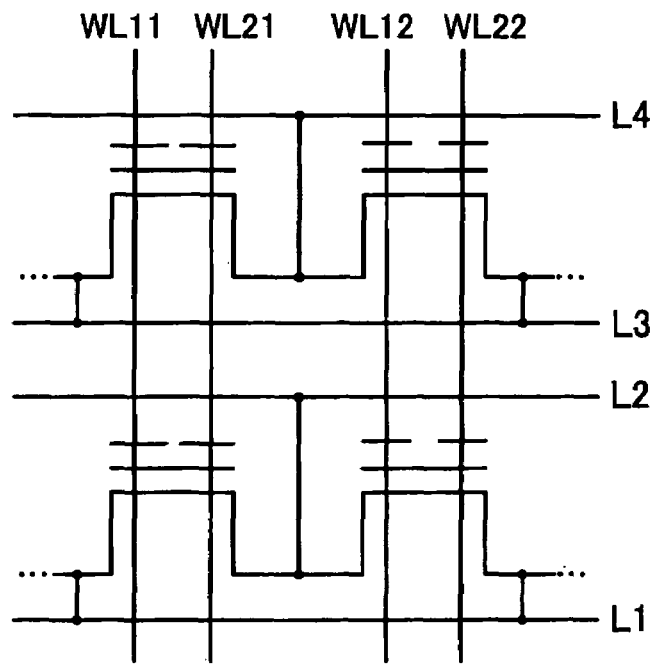

(AA CROSS SECTION) (BB CROSS SECTION)
FIG.19A
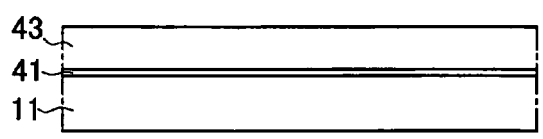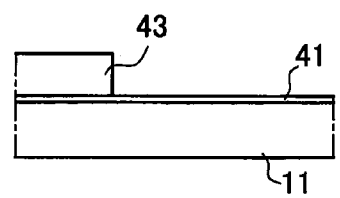
FIG.19B
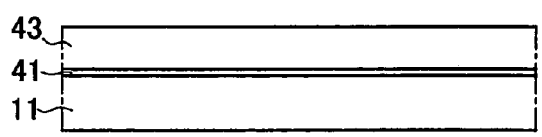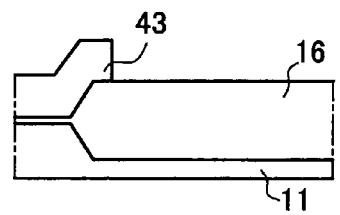
FIG.19C
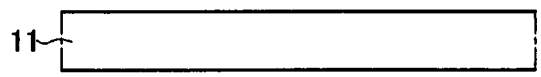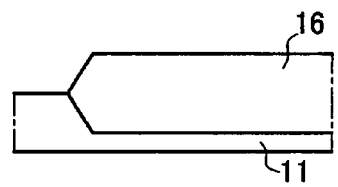
FIG.19D
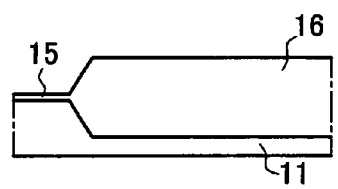
FIG.19E
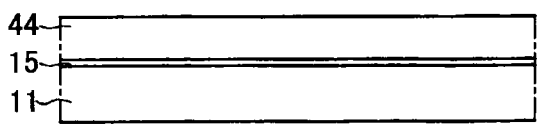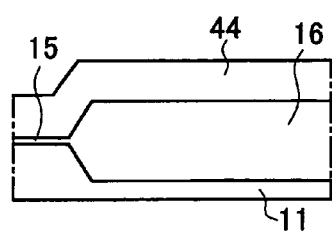

FIG.23

| | OBJECTIVE GATE | NON-OBJECTIVE GATE | SOURCE | DRAIN | SUBSTRATE |
|---|---|---|---|---|---|
| FIRST MULTI-VALUE WRITING OPERATION | FIRST VOLTAGE (9V) | SECOND VOLTAGE (0V) | THIRD VOLTAGE (0V OR FLOATING) | FOURTH VOLTAGE (0V OR FLOATING) | FIFTH VOLTAGE (0V) |
| SECOND MULTI-VALUE WRITING OPERATION | NINTH VOLTAGE (6V) | TENTH VOLTAGE (3V) | SEVENTH VOLTAGE (0V) | ELEVENTH VOLTAGE (3V) ※1 | FIFTH VOLTAGE (0V) |
| FIRST MULTI-VALUE READING OPERATION | SIXTH VOLTAGE (3V) | SIXTH VOLTAGE (3V) | SEVENTH VOLTAGE (0V) | EIGHTH VOLTAGE (1.5V) | FIFTH VOLTAGE (0V) |
| SECOND MULTI-VALUE READING OPERATION | SIXTH VOLTAGE (3V) | SIXTH VOLTAGE (3V) | SEVENTH VOLTAGE (0V) ※2 | EIGHTH VOLTAGE (1.5V) | FIFTH VOLTAGE (0V) |

※1: DIFFUSION LAYER ADJACENT TO CHANGE ACCUMULATIVE LAYER OF OBJECT OF WRITING
※2: DIFFUSION LAYER ADJACENT TO CHARGE ACCUMULATIVE LAYER OF OBJECT OF READING

| | SELECTED GATE | SELECTED GATE | SOURCE | DRAIN | SUBSTRATE |
|---|---|---|---|---|---|
| BATCH ERASING OPERATION OF CHIP OR SECTOR | TWELFTH VOLTAGE (0V) | TWELFTH VOLTAGE (0V) | THIRTEENTH VOLTAGE (FLOATING OR FOURTEENTH VOLTAGE) | THIRTEENTH VOLTAGE (FLOATING OR FOURTEENTH VOLTAGE) | FOURTEENTH VOLTAGE (9V) |
| ERASING OPERATION OF SINGLE PAGE OR 1 BIT | SELECTED GATE FIFTEENTH VOLTAGE (0V) | NON-SELECTED GATE SIXTEENTH VOLTAGE (6V) | SEVENTEENTH VOLTAGE (9V) | SEVENTEENTH VOLTAGE (9V) | FIFTH VOLTAGE (0V) |
| | SELECTED GATE | SELECTED GATE | SOURCE | DRAIN | SUBSTRATE |
| SIMULTANEOUS ERASING OPERATION OF DOUBLE PAGES | FIFTEENTH VOLTAGE (0V) | FIFTEENTH VOLTAGE (0V) | SEVENTEENTH VOLTAGE (9V) | SEVENTEENTH VOLTAGE (9V) | FIFTH VOLTAGE (0V) |

NONVOLATILE MEMORY DEVICE, AND ITS MANUFACTURING METHOD

CROSS-REFERENCES TO RELATED APPLICATIONS

This is a continuation of International Application No. PCT/JP2004/017751, filed Nov. 30, 2004 which was not published in English under PCT Article 21(2).

TECHNICAL FIELD

The present invention relates to a nonvolatile memory device with nonvolatile memory cells capable of storing multiple values, and a method of manufacturing the same.

BACKGROUND ART

To realize a nonvolatile memory device capable of storing multiple values in a nonvolatile memory cell, hitherto, it has been proposed to provide a nonvolatile memory cell with plural states. That is, the electric charge injected in the floating gate is controlled in gradual steps and the threshold voltage of the nonvolatile memory cell is changed in gradual steps so that multiple values can be stored.

For example, when the writing charge is adjusted in four steps, two bits of data can be stored in each memory cell. In this case, as shown below, the data is written in at least two steps of applying writing voltage.

In the first step, a first voltage is applied to a memory cell in an erased state, and an electric charge is injected into the floating gate as the first step charge. In the second step, depending on the data to be stored, charges are injected into each memory cell by applying a second voltage or a third voltage higher than the second voltage in order to achieve a second step charge or a third step charge larger than the second step charge. As a result, the nonvolatile memory cell holds three writing states having different threshold voltages depending on the injected charge amount. With the addition of an erased state, two-bit data of four states may be stored. When reading out the data, differences in reading current amounts is detected depending on differences in threshold voltages of the nonvolatile memory cell.

In Japanese unexamined patent publication No. 2001-156275 (hereinafter referred to as Patent Document 1), as shown in FIG. 25, a memory transistor Trmc has a gate insulating film 120 including discrete traps and a control gate electrode 170. Switch transistors Trsw having switch gate electrodes 160-1, 160-2 are provided at both sides, and diffusion layers 140-1, 140-2 connected to source lines/bit lines are formed at the outer side. By writing locally into the gate insulating film 120, one memory cell operates as a multi-storage device, accumulating information of at least two bits.

The electric charge captured in the gate insulating film including discrete traps can hardly be moved in the horizontal direction on the substrate surface from the initially captured position. At present, a silicon nitride film, and a gate insulating film including fine particles of silicon nitride are known materials for the gate insulating film including discrete traps.

The writing operation is performed by injection from the source side. When the carrier passes the closed channel of either switch transistor Trsw, it is accelerated and energy is enhanced, while the carrier jumping into the channel of the memory transistor Trmc feels a high bias in the direction of control gate electrode 170 and is discretely captured in traps. Charges are accumulated with a certain distribution in the source region of the memory transistor Trmc. By conduction of the channels beneath the switch gate electrodes 160-1, 160-2 provided at both sides of the memory transistor Trmc, charges are accumulated at both sides of the gate insulating film 120 and two-bit data is stored.

In order to inject from the source side, the writing operation is conducted at the source side. The reading channel current may also be in the same direction.

In Japanese unexamined patent publication No. 2003-282741 (hereinafter referred to as patent document 2), as shown in FIG. 26, gate insulating films ($SiO_2$ films) 250, 260 are formed on a silicon (Si) substrate 210, a pair of floating gates 270a, 270b are formed on the silicon oxide film 260, an ONO film 280 is formed to cover the floating gate 270 and silicon oxide films 250, 260, and a control gate 290 is formed as a word line on the ONO film 280. The pair of floating gates 270a, 270b are disposed independently on a source 230 and a drain 240 so that electrons from the source 230 and drain 240 can be individually injected and extracted. The floating gates 270a, 270b are side walls formed on a side wall of an insulating film which is later removed.

During the writing operation, electrons advancing in the channel from the source 230 toward the drain 240 gain a high energy near the drain 240 and become hot electrons, partly jumping over the silicon oxide film 260 to be injected into the floating gate 270b. Injection into the floating gate 270b can also be performed by inverting the bias relation of the source 230 and drain 240.

During the reading operation, while there is no electrons in the floating gates 270a, 270b, the channel is linked, and a current flows between the source 230 and drain 240, and data "1" is read out. While electrons are injected, the channel is cut off, and current does not flow between the source 230 and drain 240, and data "0" is read out. Thus, by writing, erasing, and reading out independently in the pair of floating gates 270a, 270b respectively, the storage capacity can be doubled.

DISCLOSURE OF THE INVENTION

Problems to be Solved by the Invention

As shown in the background art, when storing multiple values by varying the threshold voltage of a nonvolatile memory cell in gradual steps, the writing voltage must be changed depending on the data value in order to obtain a threshold voltage suited to the data value. The writing operation requires two or more steps, and the writing time may be longer. It also requires a voltage generating circuit for generating multiple levels of writing voltages differing for each data value. In addition, when setting multiple levels of threshold voltage in one nonvolatile memory cell, in order to assure allowance of reading at each threshold voltage, the writing voltage tends to be higher than in other case when not storing multiple values. The circuit configuration of such voltage generating circuits becomes complicated and large in scale, and the current consumption may also be greater.

In patent document 1, a writing operation having high speed and low current consumption is possible by source side injection, but the memory cell requires a three-transistor structure having a memory transistor and switching transistors provided at both sides. As a result, the area required for the memory cell is necessarily to be larger.

In patent document 2, side walls are used in the floating gates. The memory cell comprises two floating gates and a control gate placed between them. Hence, for storage of multiple values, the drain terminal and source terminal must be exchanged by a virtual grounding method when reading out, thereby complicating the reading operation. The control gate and diffusion layer region are provided between the floating gates. Hence, enough space is needed between the floating gates for locating the control gate and diffusion layer region.

Means for Solving the Problems

The invention is devised to solve at least one of the problems of the prior art, and it is an object thereof to present a nonvolatile memory device in accordance with the present invention with memory cells capable of writing with small current consumption and/or writing at high speeds in a small cell size, and a method of manufacturing the same.

A nonvolatile memory device in accordance with the present invention achieving the object stated above has memory cells, wherein each of the memory cells comprises a pair of diffusion layers arranged on a substrate surface and separated by a channel region having a predetermined length, a plurality of control gate layers each of which is formed discretely over the channel region, and at least one charge accumulative layer formed between the plurality of control gate layers and the substrate surface, the at least one charge accumulative layer having regions where charges are injected to and/or discharged from each of the plurality of control gate layers.

In a nonvolatile memory device in accordance with the present invention, a plurality of control gate layers are formed, spaced from each other, in the region on a substrate surface enclosed by a pair of diffusion layers, and a charge accumulative layer provided between the control gate layers and substrate surface forms an inherent charge accumulative region in each control gate layer.

Hence, on the charge accumulative region formed in each control gate layer, the charge can be injected and/or discharged (i.e., electrons or holes can be injected and/or discharged) and inherently provided to each control gate layer so that the data bits can be stored by a number corresponding to the number of combinations of presence and absence of charges in the region in which the charges are injected and/or discharged. By selecting the control gate layer for injecting and/or discharging the charges, multiple values can be stored and it is not required to change the first voltage to be applied to the control gate layer depending on the data value to be written, permitting multiple values to be stored in one writing operation.

Data values can be stored in accordance with the number of bits corresponding to the number of control gate layers. As compared with patent document 1 which requires as many switch transistors as the number of bits to be stored, aside from the memory transistor, the area requirements of a memory cell can be reduced in accordance with the present invention.

Concerning charge injection into the charge accumulative layer, in addition to a channel injection operation on the basis of Fowler-Nordheim (FN) tunneling from the substrate beneath the control gate layer in which the first voltage is applied, a source injection operation is possible in accordance with the present invention on the basis of hot electron injection or hot hole injection to accelerate the charge by forming a channel beneath the control gate layer adjacent to the control gate layer in which a voltage is applied. Channel injection operation allows a writing operation having low current consumption using FN tunneling, and the source injection operation allows a writing operation of low current consumption at high speeds.

Effects of the Invention

In accordance with the present invention, a nonvolatile memory device with nonvolatile memory cells capable of storing multiple values has memory cells of small size, small current consumption during writing, and/or fast writing speed. In addition, a method of manufacturing the same is disclosed herein.

BRIEF DESCRIPTION OF THE DRAWINGS

FIG. 15 is a layout diagram of a NAND configuration of a memory cell in accordance with an embodiment of the present invention.

FIG. 16 is a layout diagram of a NOR configuration of a memory cell in accordance with an embodiment of the present invention.

FIGS. 19A to 19E are a first set of cross sectional views of a manufacturing process of the memory cell in FIG. 18 (up to deposition of mask layer) in accordance with the present invention.

FIG. 23 is a diagram showing voltage conditions during each operation of the memory cell of FIG. 18 in accordance with an embodiment of the present invention.

DETAILED DESCRIPTION OF THE INVENTION

Embodiments of nonvolatile memory devices in accordance with the present invention and the manufacturing method in accordance with the present invention are described below in reference to FIG. 1 to FIG. 24.

Figure 1:
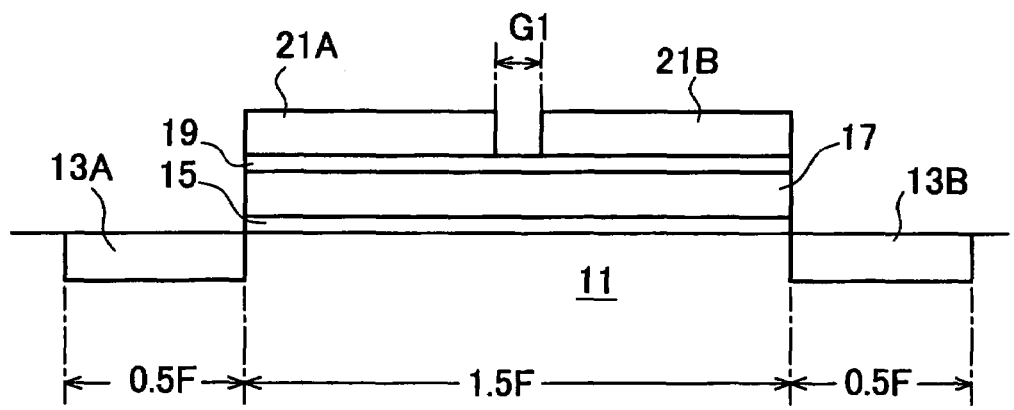
FIG. 1 is a cross sectional view of a structure of a memory cell provided in a nonvolatile memory device in accordance with the present invention.

A cross sectional view in FIG. 1 shows a structure of a memory cell provided in a nonvolatile memory device in accordance with the present invention. A pair of diffusion layers 13A, 13B are disposed on a substrate 11 at a spacing of 1.5F. Each diffusion layer has a width of 0.5F and is shared with the adjacent memory cell, additionally serving as the diffusion layer therefor. On a channel region enclosed by the diffusion layers 13A, 13B, a first insulating layer 15, a charge accumulative layer 17, and a second insulating layer 19 are laminated in that order, and on the second insulating layer 19, two control gate layers 21A, 21B spaced at gap G1 are disposed in the middle as measured in the channel width direction. Herein, F is the minimum processing dimension, and the memory cell is composed in an area of $2.5F^2$. Generally, the substrate 11 is composed of P type semiconductor material, and the diffusion layers 13A, 13B are of N type semiconductor material.

The control gate layers 21A, 21B spaced at gap G1 are separated at the midpoint in the channel length direction, and the voltage can be applied separately to the control gate layers 21A, 21B. The control gate layer 21A is disposed adjacently to the diffusion layer 13A, and the control gate layer 21B is disposed adjacently to the diffusion layer 13B. The charge accumulative layer 17 beneath the control gate layers 21A, 21B is formed commonly between the control gate layers 21A, 21B.

Data is stored in the memory cell depending on the presence or absence of charge in the charge accumulative layer 17. The charge is injected and/or discharged in the charge accumulative layer 17 depending on voltage application to the control gates 21A, 21B as explained later in reference to FIGS. 3 to 5, 9, 10, 13 and 14. By using nitride film or small conductive particles having discrete charge traps in the charge accumulative layer 17 and/or by utilizing charge traps existing in the vicinity of the interface of the charge accumulative layer 17 and the first and/or second insulating layer(s) 15, 19, the movement of the charge within the charge accumulative layer 17 as it is injected therein can be limited.

As a result, in one charge accumulative layer 17, the charge injected therein, depending on the writing voltage applied in each one of control gate layers 21A, 21B, can be localized beneath the control gate layers 21A, 21B in which the writing voltage has been applied. In each charge accumulated region in the charge accumulative layer 17 beneath the control gate layers 21A, 21B, the presence or absence of charge can be controlled and multiple values can be stored in the memory cell. In FIG. 1, since the memory cell depicted therein has two control gate layers 21A, 21B, it is possible to store four states for, for example, two-bit data storage.

The gap G1 is not particularly specified as far as the control gate layers 21A, 21B and can be securely separated electrically in the manufacturing process. As compared with the case of forming a diffusion layer on the substrate surface through gap G1 or keeping a connection region with an upper layer, the gap can be designed smaller. The control gate layers 21A, 21B disposed above the charge accumulative layer 17 will not be formed up to the side of diffusion layers 13A, 13B by surpassing the charge accumulative layer 17. Hence, the gap G1 may be defined as the minimum limit therebetween, and contacts for connecting with the upper wiring layer can be disposed on the diffusion layers 13A, 13B with the peripheral parts densely concentrated at the side of the charge accumulative layer 17, thereby reducing the memory cell size.

When the first insulating layer 15 and second insulating layer 19 are made of, for example, silicon oxide ($SiO_2$), and the charge accumulative layer 17 is made of, for example, silicon nitride ($Si_3N_4$), a so-called ONO film is composed by the first insulating layer 15, the charge accumulative layer 17, and the second insulating layer 19, and it functions as a floating gate layer of the memory cell and a gate insulating film at the same time. It also performs the function of electrically insulating the charge accumulative layer 17 and the control gate layers 21A, 21B. When the charge accumulative layer 17 performs the charge trap function and the substrate 11 and/or control gate layers 21A, 21B perform the insulating function, the first insulating layer 15 and/or the second insulating layer 19 may not be needed.

The charge accumulative layer 17 has a structure having charge traps limiting the move of charge within the layer, and the charge accumulative layer 17 is not separated between the control gate layers 21A, 21B but is commonly provided. The present invention, however, is not limited to this structure alone. Depending on the gap G1 of spacing between the control gate layers 21A, 21B, the second insulating layer 19 and charge accumulative layer 17, and/or the first insulating layer 15 may also have a gap formed therein. In this case, an independent charge accumulative layer is provided in each one of the control gate layers 21A, 21B. Hence, the charge is injected and discharged in every independent charge accumulative layer individually in the control gate layers 21A, 21B.

In this case, the charge accumulative layer, aside from the material having charge traps mentioned above, may be formed of a conductive material, such as polycrystalline silicon material. When using a material having charge traps, the charge moving between the charge accumulative layers beneath the control gate layers 21A, 21B can be blocked more securely. Also when using a material having charge traps, if spacing of charge accumulative layers is not sufficient due to manufacturing fluctuations or the like, since movement of the injected charge is limited, loss of stored data or other such problems can be prevented. By using a conductive material such as polycrystalline silicon material, the required structure may be similar to the floating gate of ordinary nonvolatile memory cells for storing one-bit data, and the manufacturing process can be simplified.

The gap G1 is intended to separate the control gate layers 21A, 21B, enough to permit individual control and injection of charges in the charge accumulative layer 17 separate from each other. Therefore, the formation and position of the gap G1 and the width thereof are not strictly specified, and it is possible to form the gap G1 in any of a number of simple manufacturing processes.

Figure 2:
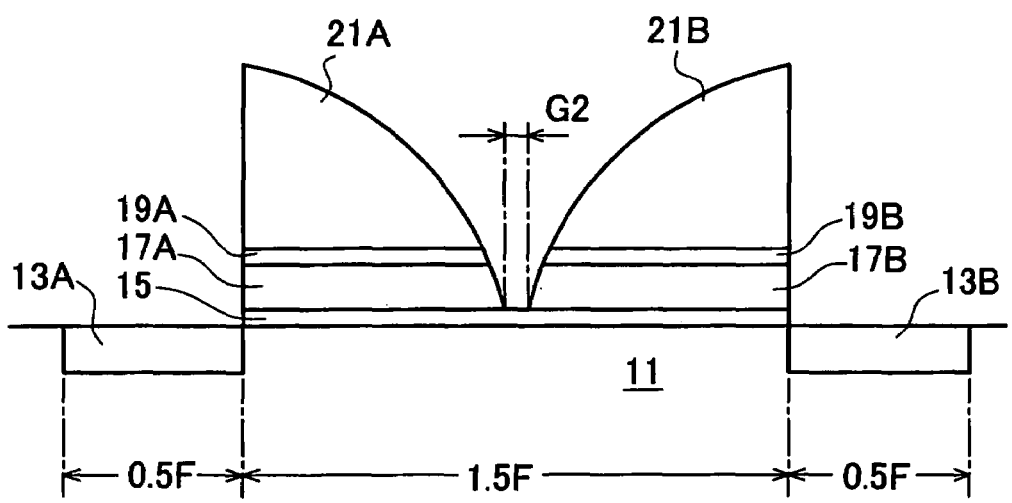
FIG. 2 is a cross sectional view of an embodiment of the memory cell of FIG. 1.

A cross sectional view in FIG. 2 shows an embodiment of the memory cell in accordance with the present invention. As described later in the manufacturing process in reference to FIGS. 19 to 22, after depositing a mask layer (not shown) on diffusion layers 13A, 13B, a charge accumulative piled layer, a second insulating piled layer, and a gate piled layer are laminated on the entire surface. The channel region enclosed by the pair of diffusion layers 13A, 13B is enclosed by mask layers deposited on the diffusion layers 13A, 13B, and a recess is formed therebetween. These piled layers are also stacked up on the channel region along the mask layer.

Thereafter, the laminated layers are removed up to the charge accumulative piled layer by anisotropic etching. Anisotropic etching is selective etching in the lamination thickness direction. Aside from the upper portion of the mask layer, in the channel region, the etched portion (the portion stacked up along the side wall of the mask layer) has a deep thickness in the etching direction and an unetched portion is left over. This is the so-called side wall structure. Etching is less at a position closest to the side wall of the mask layer, and the etching amount increases as it moves away from the side wall, forming a gap G2 in the middle therebetween. Hence, in the middle of the channel region, mutually facing arch shapes are formed, thereby separating the control gate layers 21A, 21B, second insulating layers 19A, 19B, and charge accumulative layers 17A, 17B.

In accordance with the present invention, the gap G2 is not particularly specified when using a material having charge traps in the charge accumulative layer, so long as the control gate layers 21A, 21B can be securely separated during the manufacturing process. When using a conductive material such as polycrystalline silicon material in the charge accumulative layer, it is enough for the purposes of the present invention that the control gate layers 21A, 21B, the second insulating layers 19A, 19B, and the charge accumulative layers 17A, 17B can be securely separated during the manufacturing process. As compared with a memory cell requiring forming a diffusion layer on the substrate surface through gap G2 or connecting with an upper layer therefrom, the gap G2 may be smaller, therby reducing the memory cell size.

Utilizing the side wall structure at the mask layer side wall formed by anisotropic etching, the charge accumulative layers 17A, 17B can be separated from the control gate layers 21A, 21B in the middle of the channel region, thereby further reducing the memory cell size.

Other actions and effects of the memory cell in FIG. 2 are similar to the structural diagram and principles of the memory cell in FIG. 1, so repeating such description is omitted.

Figure 3:
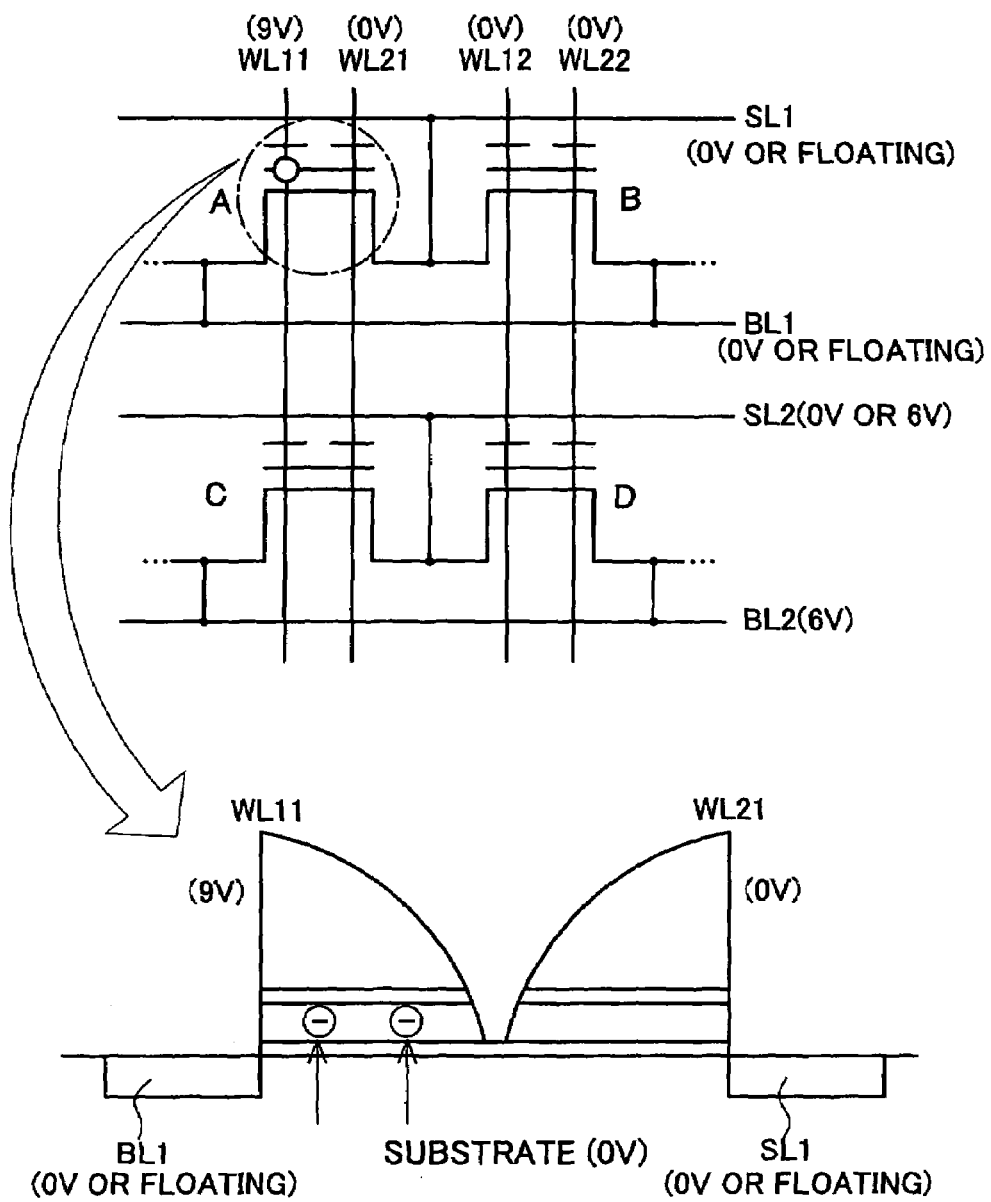
FIG. 3 is a first diagram of a writing operation of first multi-value storage in a memory cell in accordance with an embodiment of the present invention.
Figure 4:
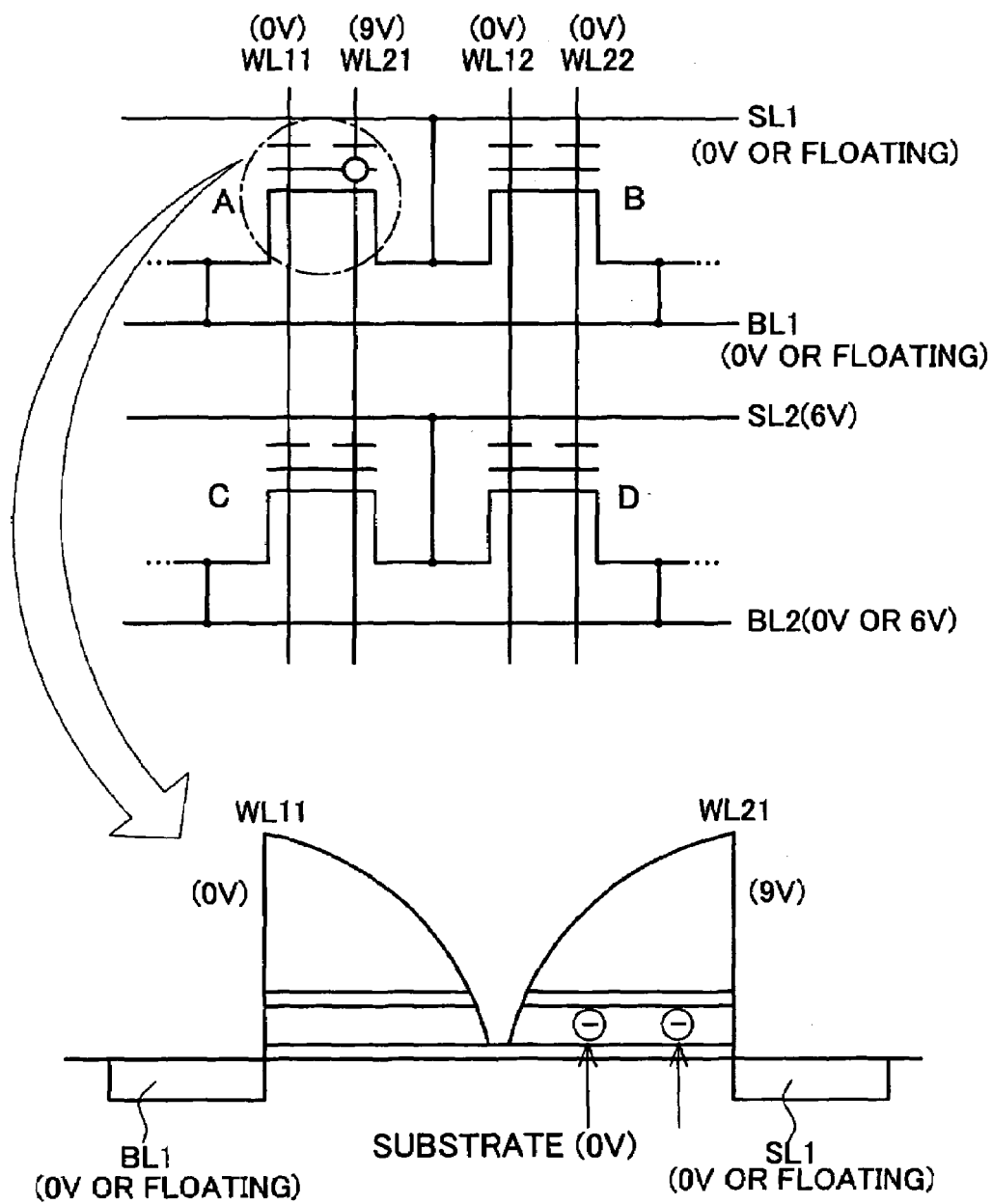
FIG. 4 is a second diagram of a writing operation of first multi-value storage in a memory cell in accordance with an embodiment of the present invention.
Figure 5:
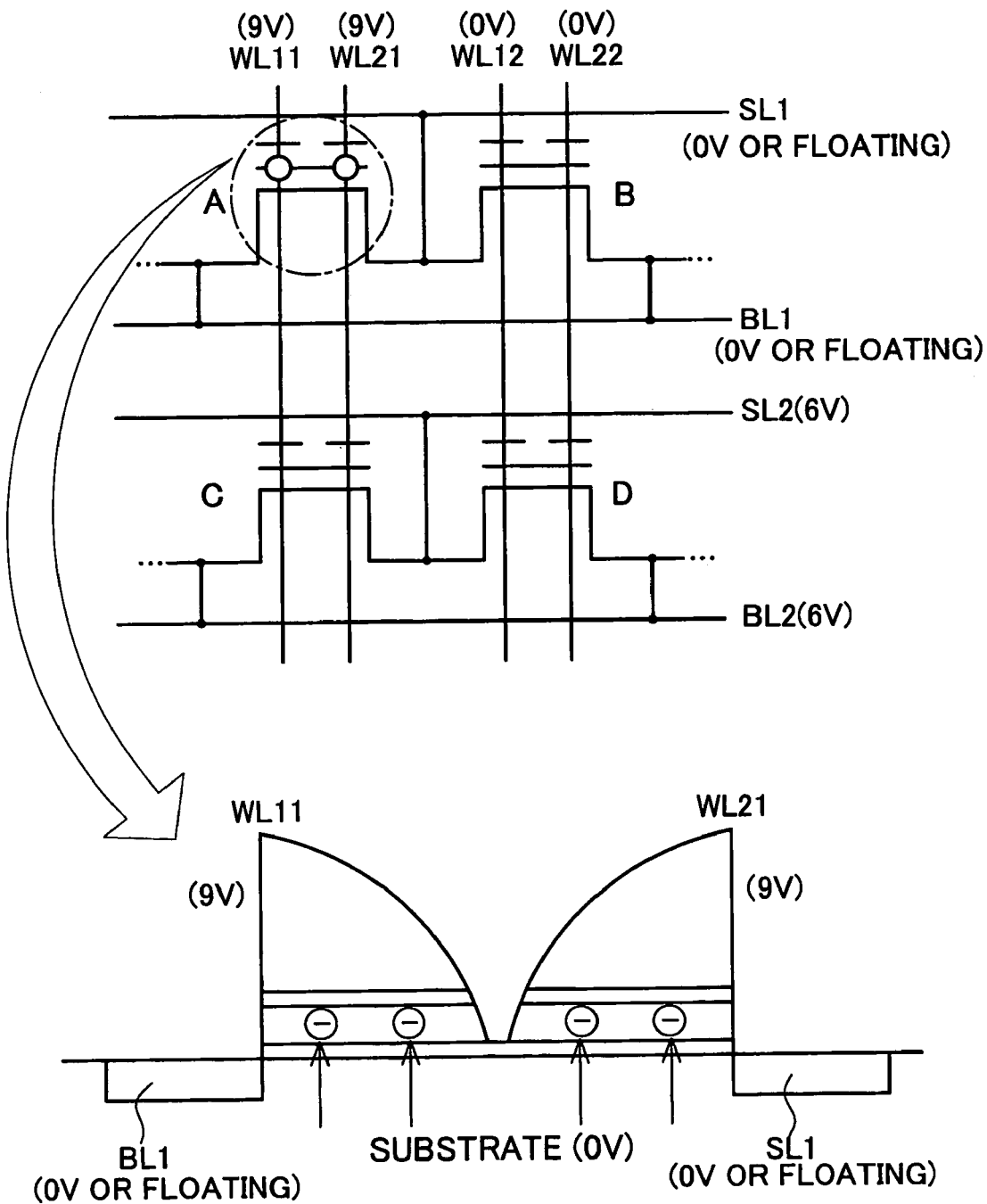
FIG. 5 is a third diagram of a writing operation of first multi-value storage in a memory cell in accordance with an embodiment of the present invention.
Figure 11:
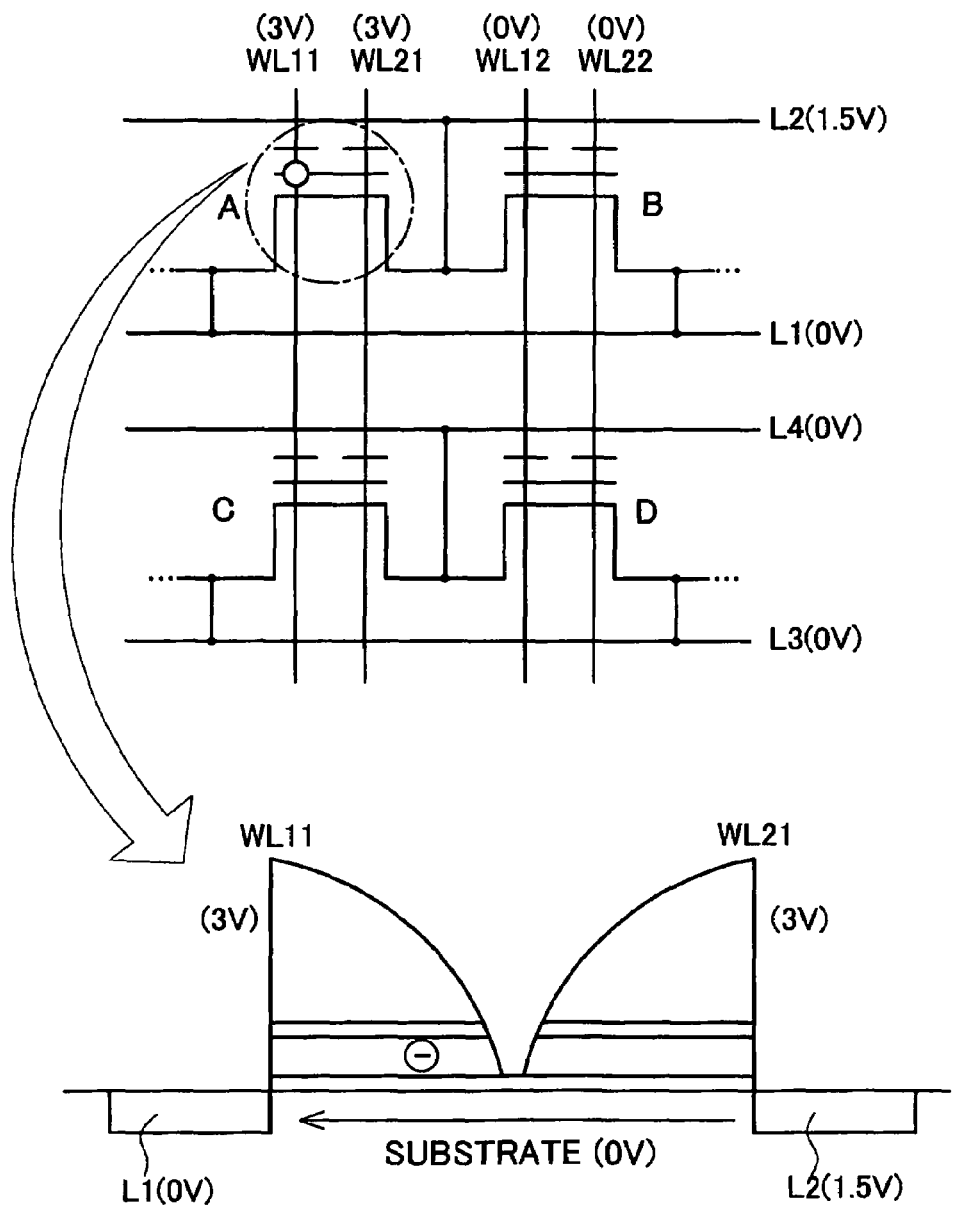
FIG. 11 is a first diagram of a reading operation of second multi-value storage in a memory cell in accordance with an embodiment of the present invention.
Figure 12:
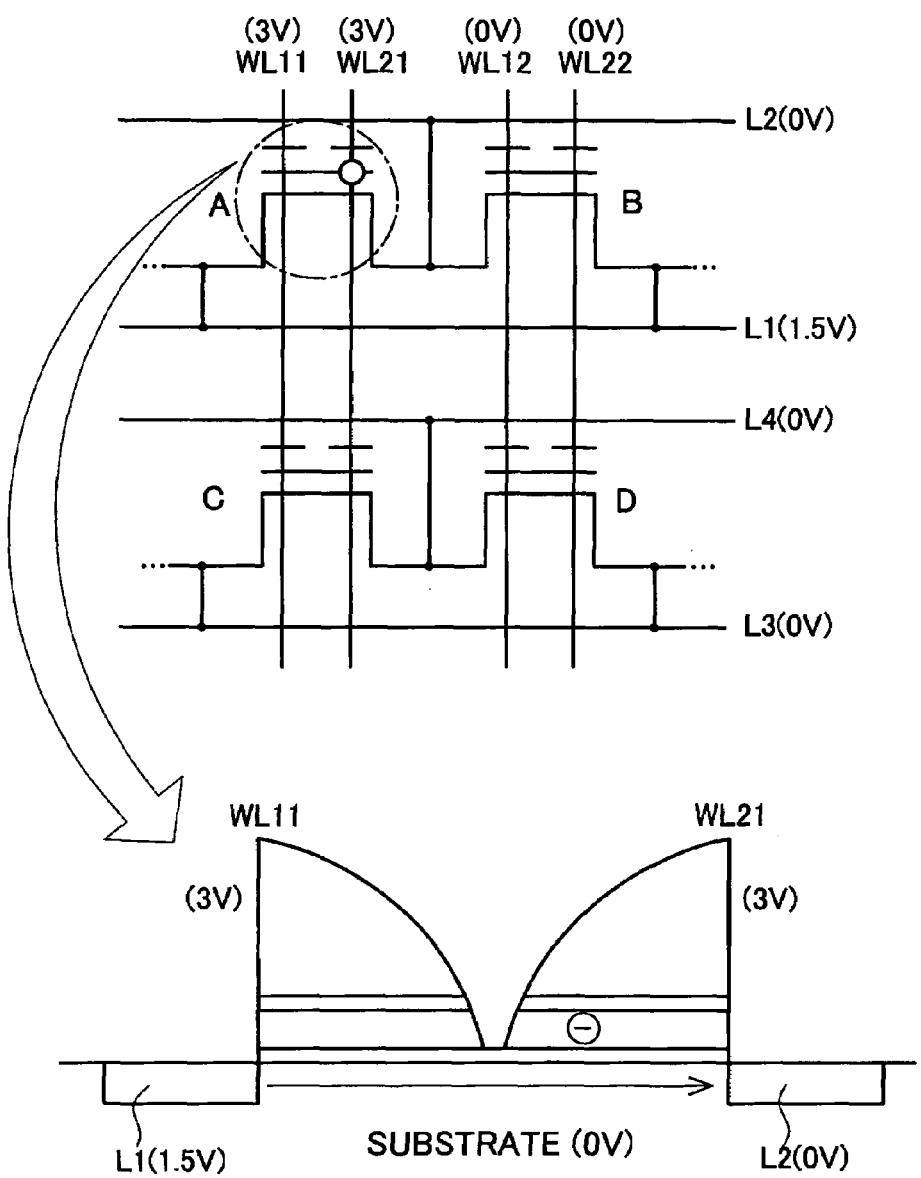
FIG. 12 is a second diagram of a reading operation of second multi-value storage in a memory cell in accordance with an embodiment of the present invention.
Figure 13:
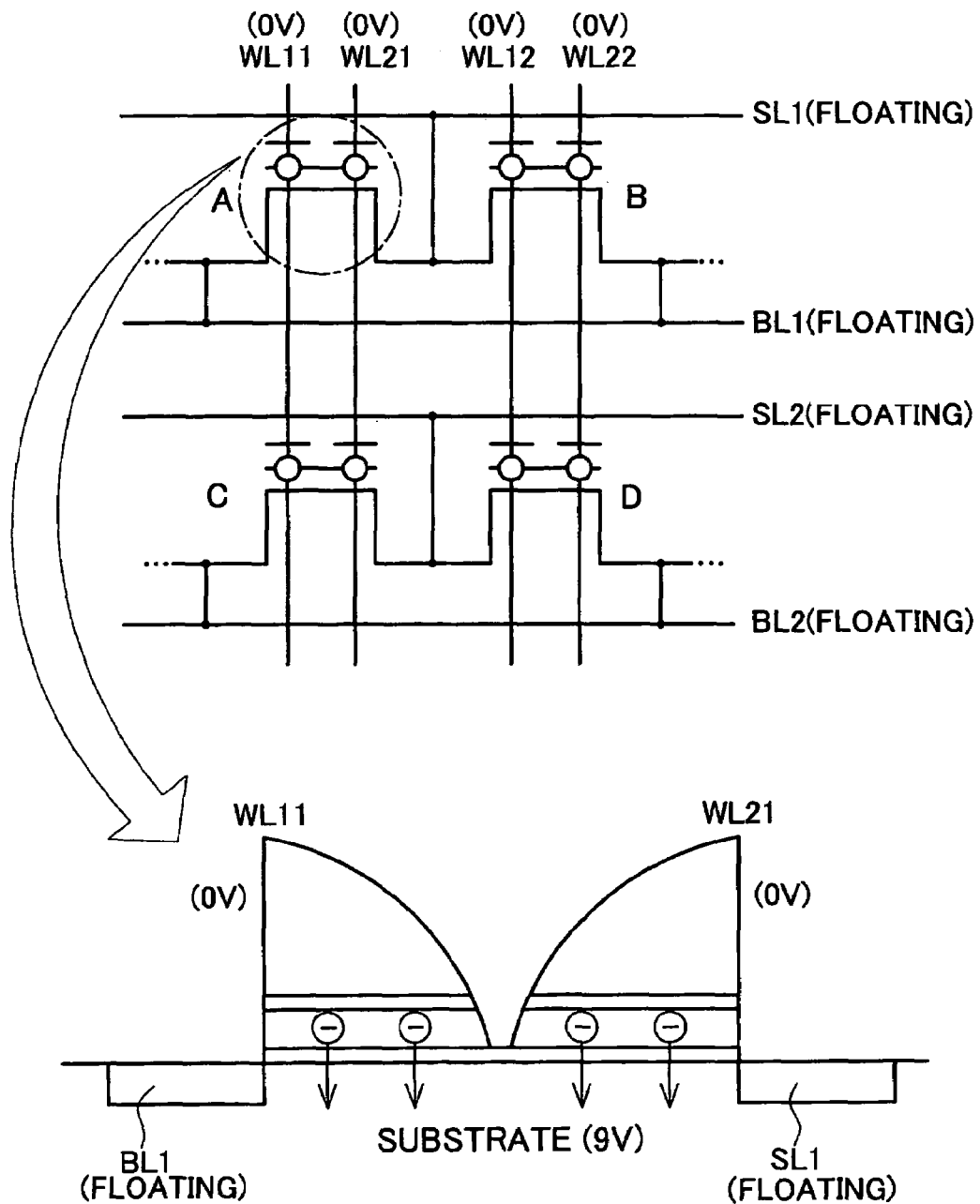
FIG. 13 is a diagram of an erasing operation (channel erase) in a memory cell in accordance with an embodiment of the present invention.
Figure 14:
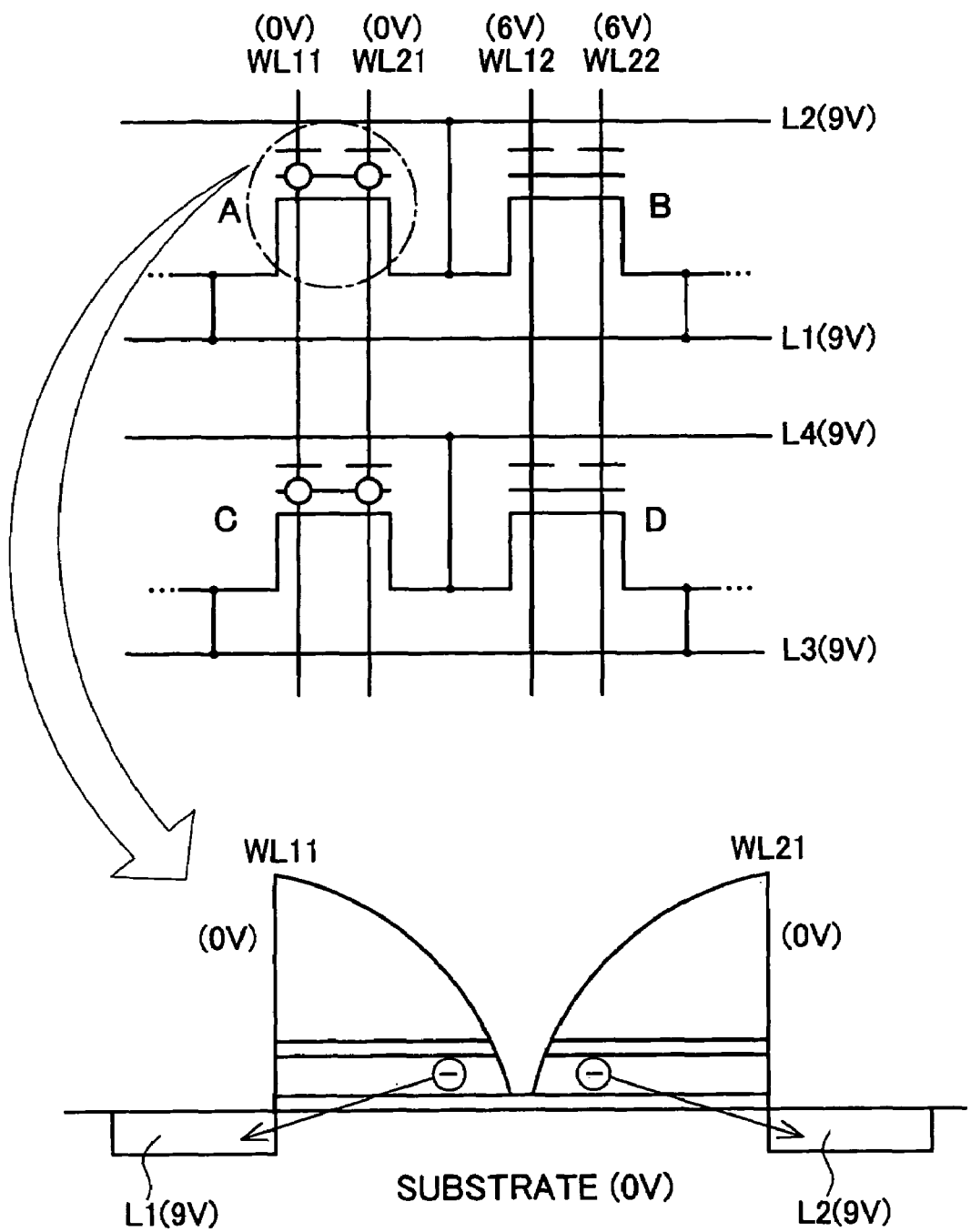
FIG. 14 is a diagram of an erasing operation (source erase) in a memory cell in accordance with an embodiment of the present invention.

FIGS. 3 to 14 are diagrams explaining the writing operation and the reading operation in a memory cell in accordance with the present invention, a voltage applied state during the erasing operation in accordance with the present invention, charge injection into the charge accumulative layer in accordance with the present invention, and charge discharge from the charge accumulative layer in accordance with the present invention. The voltage applied state refers to an example of a memory cell array having memory cells A to D arranged in a matrix, and the charge injecting and/or discharging operations refer to an example in the cross sectional view of memory cell shown in FIG. 2. The writing operation is shown in FIGS. 3 to 5 and FIGS. 9 and 10, and the reading operation is shown in FIGS. 6 to 8 and FIGS. 11 and 12. FIGS. 3 to 5 show the case of a first multi-value storage operation of a writing operation in accordance with the present invention by charge injection from the channel, and FIGS. 9 and 10 the case of a second multi-value storage operation of a writing operation in accordance with the present invention by charge injection from the source. FIGS. 13 and 14 show the erasing operations. Channel erase and source erase are shown respectively.

The first multi-value storage operation in accordance with the present invention is hereinafter explained. When the memory cell has plural control gate layers, by applying writing voltage independently in the control gate layers, the charge is injected in the inherent charge accumulative region beneath each control gate layer and a data value is stored in each control gate layer corresponding to a combination of presence or absence of charge in the charge accumulative region beneath, thereby enabling multi-value storage. Charge is injected from the channel by FN tunneling.

FIGS. 3 to 5 describe a writing operation in accordance with the present invention. The memory cell has two control gate layers, and three writing states can be implemented. Memory cells A and B share source line SL1 and bit line BL1 connected respectively to a pair of diffusion layers, and memory cells C and D share source line SL2 and bit line BL2 similarly connected respectively to a pair of diffusion layers. A pair of control gate layers of memory cells A and C are respectively connected to word lines WL11 and WL21 as control lines, and a pair of control gate layers of memory cells B and D are respectively connected to word lines WL12 and WL22 as control lines.

Next, the case where memory cell A is the object of the writing operation is described. In FIG. 3, charge is injected into the charge accumulative layer indicated by the small circle mark in memory cell A. When the source line SL1 to which the memory cell A is connected has a third voltage of 0 V or in the floating state, the bit line BL1 is maintained at a fourth voltage of 0 V or in the floating state, and the substrate has a fifth voltage of 0 V, the word line WL11 at control gate is at a first voltage of 9 V. In this case, reverse bias is not applied between the diffusion layer and the substrate, and a depletion layer is not extended. Hence an electric field is applied from the control gate layer to which the word line WL11 is connected toward the substrate. By this electric field, charge is accelerated, and it is injected from the substrate by an FN tunneling current into the charge accumulative layer beneath the control gate layer to which the word line WL11 is connected.

In another control gate layer of memory cell A, the word line WL21 is connected as the other control gate and a second voltage of 0 V is applied to the word line WL21. The charge is not accelerated towards the charge accumulative layer, and it is not injected into the charge accumulative layer beneath the word line WL21. Since 0 V is also applied to the word lines 12, 22, charge is not injected into memory cell B. That is, in the other control gate, only voltage may be applied between the charge accumulative layer and substrate to an extent not to induce FN tunneling action.

Zero V or 6 V is applied to the source line SL2 to which diffusion layers of memory cells C and D are connected, and 6 V is applied to the bit line BL2. As for memory cell C, 9 V is applied to the control gate layer connected to the word lines WL11, and in the adjacent diffusion layer, bit line BL2 is connected and 6 V is applied. As a result, the diffusion layer and substrate are reversely biased and a depletion layer is formed. The electric field between the control gate layer and substrate is lessened. In memory cell C, charge is not injected into the charge accumulative layer depending on whether the word line WL11 provided with 9 V, thus preventing disturbing phenomenon in memory cell C.

FIG. 4 shows a case of charge injection into the charge accumulative layer indicated by the small circle mark by application of a first voltage of 9 V to the word line WL21 in memory cell A. In FIG. 3, 9 V is applied to word line WL21 at one control gate instead of the word line WL11, and a second voltage of 0 V is applied to word line WL11 at the other control gate. Further, to prevent disturbing phenomenon of memory cell C to which word line WL21 provided with the first voltage of 9 V is connected, depending on the switching of word lines to which 9 V is applied, 6 V is applied to the source line SL2, and 0 V or 6 V is applied to the bit line BL2. The actions and effects are same as in FIG. 3, and further description is omitted.

FIG. 5 shows a case of charge injection into the charge accumulative layer indicated by the small circle marks by application of a first voltage of 9 V to the word lines WL11, WL21 in memory cell A. This is a case of injection of charge into both of the two charge accumulative layers in memory cell A. In FIG. 3, 9 V is applied to word line WL21, in addition to the word line WL11. Further, to prevent the disturbing phenomenon of memory cell C to which word lines WL11 and WL21 biased at 9 V are connected, 6 V is applied to the source line SL2 and to the bit line BL2. The actions and effects are same as in FIG. 3, and further description is omitted.

In the writing operation in the first multi-value storage operation in accordance with the present invention, by applying a writing voltage (9 V) as a first voltage in each control gate layer, charge can be localized and injected into the charge accumulative layer beneath each control gate layer. As a result, in one memory cell having two control gate layers, two-bit data, (i.e., data of four states) can be stored. Since charge is injected by FN tunneling into the charge accumulative layer in a range positioned beneath the control gate layer from the substrate, local damage on the gate oxide film is advantageously smaller as compared with the injection method of charge by making use of the hot electron phenomenon.

Figure 6:
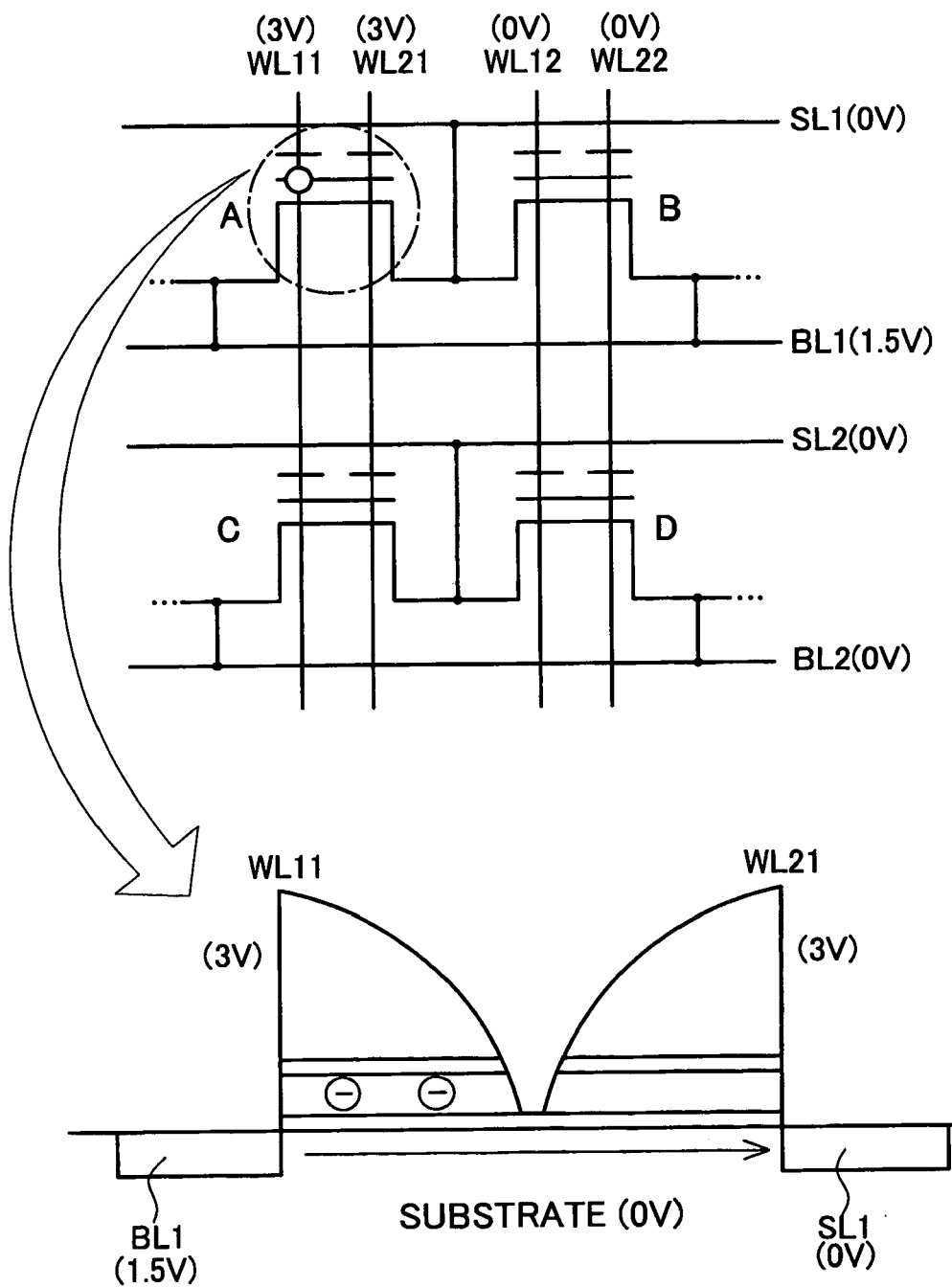
FIG. 6 is a first diagram of a reading operation of first multi-value storage in a memory cell in accordance with an embodiment of the present invention.
Figure 7:
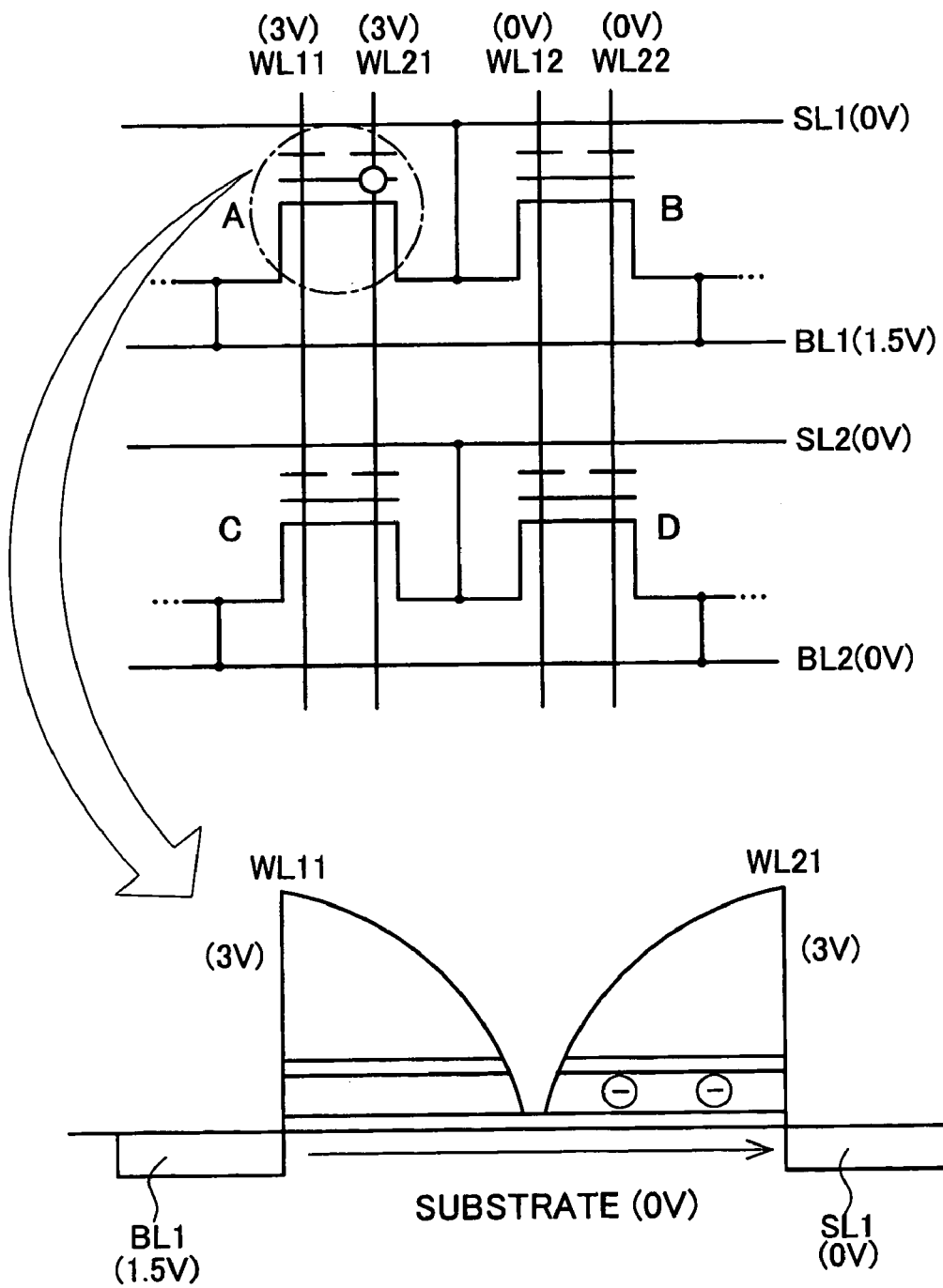
FIG. 7 is a second diagram of a reading operation of first multi-value storage in a memory cell in accordance with an embodiment of the present invention.
Figure 8:
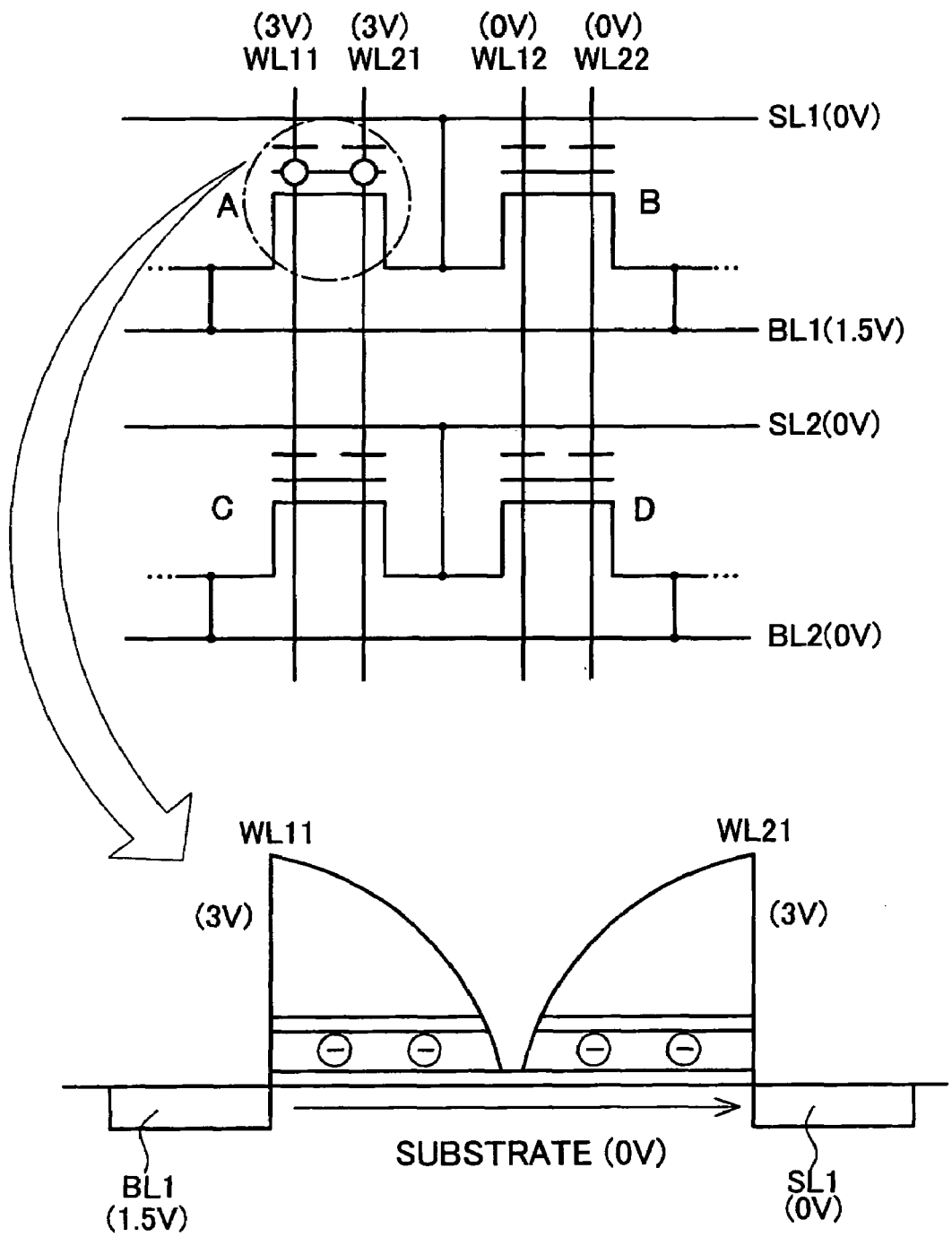
FIG. 8 is a third diagram of a reading operation of first multi-value storage in a memory cell in accordance with an embodiment of the present invention.

FIGS. 6 to 8 refer to the reading operation. The diagrams respectively show the content of a memory cell A after the writing operation in FIGS. 3 to 5, respectively. In the first multi-value storage operation, when reading out, the source line side and bit line side are fixed in a pair of diffusion layers. In FIGS. 6 to 8, source line SL1 is connected to one diffusion layer and bit line BL1 is connected to the other diffusion layer. In the reading operation, regardless of the stored data, a seventh voltage of 0 V is applied to source line SL1, an eighth voltage of 1.5 V is applied to bit line BL1, a sixth voltage of reading voltage 3 V is applied to word lines WL11 and WL21, and both control gate layers are biased at 3 V, thereby executing the reading operation depending on the magnitude of the current flowing between the diffusion layers.

FIG. 6 is a case of injection and accumulation of charges in the charge accumulative layer beneath the control gate layer connected to the word line WL11. In the memory cell A, charges are accumulated in the charge accumulative layer at the bit line BL1 side, but no charge is accumulated in the charge accumulative layer at the source line SL1 side. As a result, at the bit line BL1 side, the potential lowered from 3 V by the accumulation of charges faces the channel region, and, at the source line SL1 side, the 3 V potential faces the channel region, thereby applying 3 V between the gate and the source. Since a sufficient gate bias is applied at the source line SL1 side, a sufficiently large first current flows in the channel.

FIG. 7 is a case of injection and accumulation of charges in the charge accumulative layer beneath the control gate layer connected to the word line WL21. In memory cell A, no charge is accumulated in the charge accumulative layer at the bit line BL1 side, but charges are accumulated in the charge accumulative layer at the source line SL1 side. As a result, at the bit line BL1 side, the potential of 3 V faces the channel region, and, at the source line SL1 side, the potential lowered from 3V by accumulation of charges faces the channel region, applying a voltage lower than 3 V between the gate and source. Since the gate bias is limited at the source line SL1 side, the current flowing in the channel is lower than the first current in FIG. 6, and a second current flows.

FIG. 8 is a case of injection and accumulation of charges in the charge accumulative layer beneath the control gate layer connected to the word lines WL11 and WL21. In memory cell A, charges are accumulated in both charge accumulative layers at the bit line BL1 side and source line SL1 side. As a result, at both the bit line BL1 side and the source line SL1 side, the potential lowered from 3V by accumulation of charges faces the channel region. The gate bias is limited at both the bit line BL1 side and the source line SL1 side, and the current flowing in the channel is lower yet, lower than the second current in FIG. 7, and a third current flows. Although not shown in the diagram, in memory cell A where no charge is accumulated in the charge accumulative layer beneath the control gate layer connected to the word lines WL11 and WL21, at both the bit line BL1 side and the source line SL1 side, the 3 V potential of the control gate layer faces the channel region and a sufficient gate bias is applied, so that a fourth current larger than the first current in FIG. 6 flows in the channel.

In the reading operation, generally, in accordance with the present invention, a fifth voltage of 0 V is applied to the substrate.

In the reading operation in a first multi-value storage operation in a pair of diffusion layers in the memory cell, connection relative to the source line and the bit line is fixed, whereas the gate bias is variable along the channel length depending on the injection of charges into the charge accumulative layers beneath the two control gate layers disposed along the channel length direction between the diffusion layers. As a result, the channel current is variable depending on the accumulation of charges in the combination of charge accumulative layers, enabling the read out of multi-value data.

A second multi-value storage operation in accordance with the present invention is also hereinafter explained. When the memory cell has two (i.e., a pair of) control gate layers in the channel region along the channel length direction, while applying writing voltage as a ninth voltage in one control gate layer, auxiliary voltage is applied as a tenth voltage to the other control gate layer. As a result, the control gate layer provided with auxiliary voltage is used as an auxiliary transistor and the charge entered from the adjacent diffusion layer is accelerated, thereby injecting charges into the charge accumulative layer beneath the control gate layer provided with writing voltage. This is a case of injecting the charge from either diffusion layer and injecting the charge into the control gate layer adjacent to the other diffusion layer. The charge accelerated by the auxiliary transistor generates the hot electron phenomenon beneath one control gate layer and the obtained charge is injected into the channel.

Figure 9:
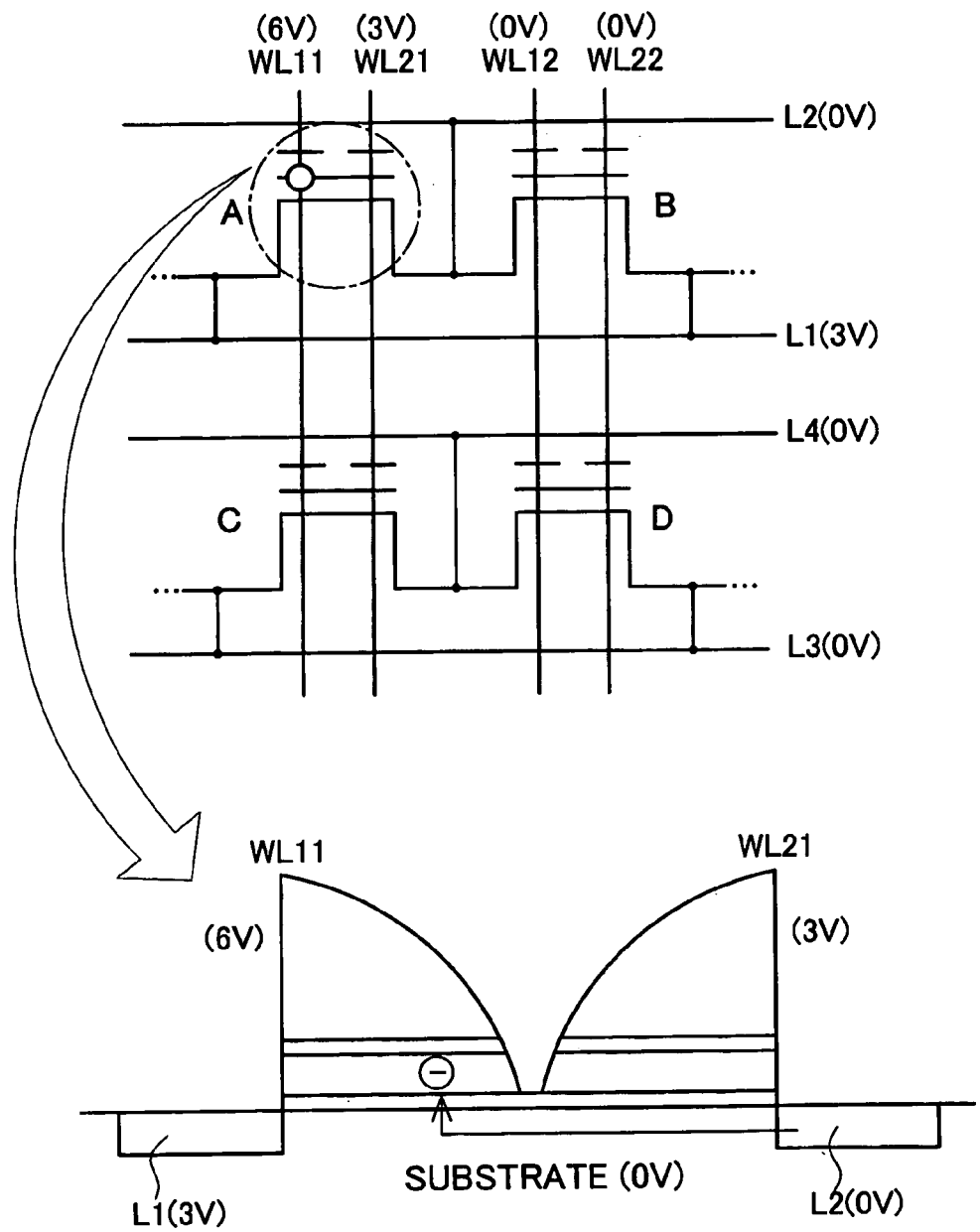
FIG. 9 is a first diagram of a writing operation of second multi-value storage in a memory cell in accordance with an embodiment of the present invention.
Figure 10:
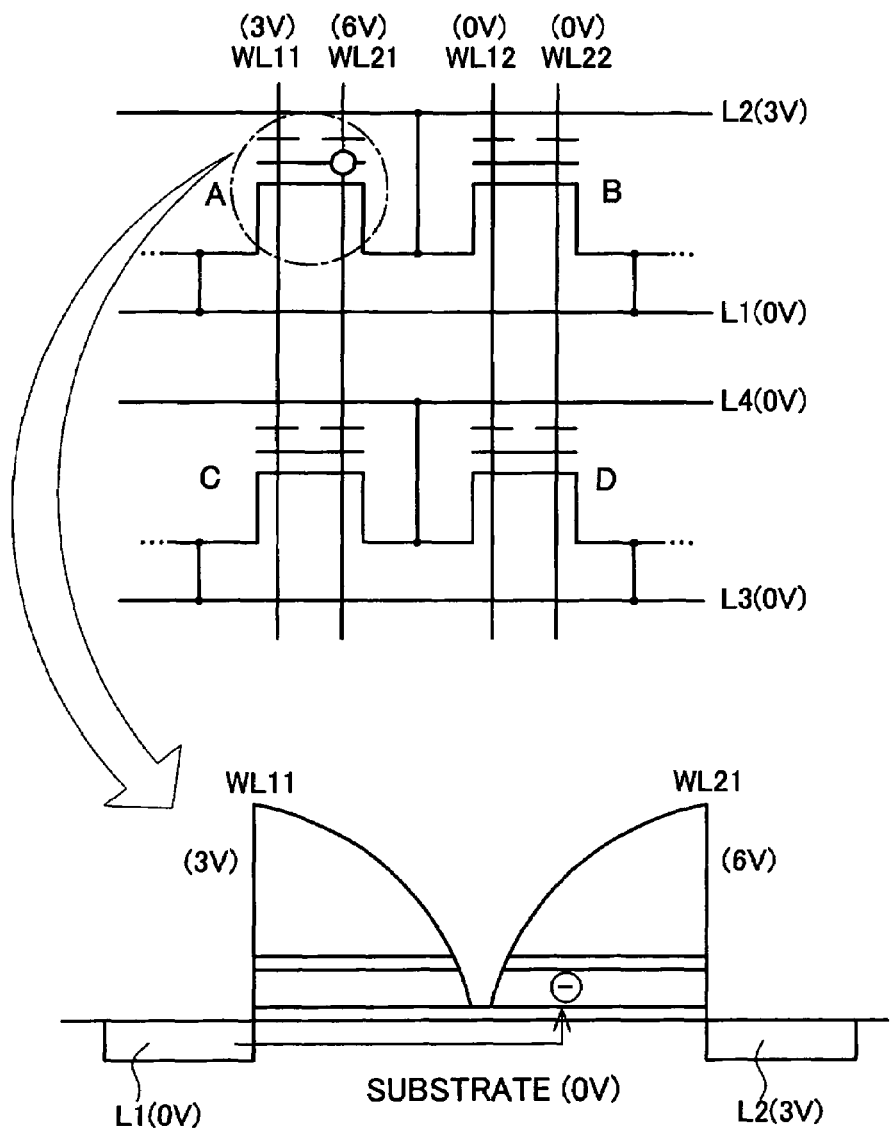
FIG. 10 is a second diagram of a writing operation of second multi-value storage in a memory cell in accordance with an embodiment of the present invention.

FIGS. 9 and 10 refer to the writing operation. A basic structure has two control gate layers in the channel length direction. Beneath one control gate layer, the charge entered from the lower side of the other control gate layer is injected. The writing operation is thus executed on two control gate layers. In memory cells A and B, distribution lines L1, L2 are connected to each one of the diffusion layers, and in memory cells C and D, distribution lines L3, L4 are connected to each one of the diffusion layers. A pair of control gate layers of memory cells A and C are connected respectively to word lines WL11 and WL21, and a pair of control gate layers of memory cells B and D are connected respectively to word lines WL12 and WL22 as control lines.

In FIG. 9, memory cell A is the object of writing. Charge is injected into the charge accumulative layer indicated by the small circle mark in memory cell A. Of the distribution lines L1, L2 to which the memory cell A is connected, the distribution line L1 is connected to one diffusion layer adjacent to the charge accumulative layer indicated by the small circle mark and is provided with an eleventh voltage of 3 V, and the distribution line L2 is connected to the other diffusion layer and is provided with a seventh voltage of 0 V. The substrate is provided with a fifth voltage of 0 V. Further, the word line WL11 is connected to one control gate layer on the charge accumulative layer indicated by the small circle mark and is provided with a ninth voltage of 6 V. The word line WL21 is connected to the other adjacent control gate layer and is provided with a tenth voltage of 3 V. In this case, the other control gate layer to which the word line WL21 is connected functions to accelerate the charge and operates as auxiliary transistor. The charge entered from the distribution line L2 is accelerated and provided in the channel region beneath the control gate layer, thereby providing 3 V thereto. In the state of reaching beneath the control gate layer provided with 6 V, it becomes hot electrons having a high kinetic energy. The charge generated by these hot electrons is injected into the charge accumulative layer accelerated in the direction of one control gate layer provided with 6 V. Electrons are injected by the hot electron current.

Then, the voltage of 3 V applied as a tenth voltage to the word line WL21 is a voltage for forming a channel in a channel region beneath the other control gate layer connected to the word line WL21. For example, when a voltage similar to a reading state of an auxiliary transistor is applied, the charge entered from the distribution line L2 is accelerated in the direction of one control gate layer connected to the word line WL11.

Concerning memory cells C and D, the distribution lines L3, L4 are at 0 V. The memory cell C is connected to word lines WL11, WL21 commonly with the memory cell A. However, since both distribution lines L3, L4 are at 0 V, the charge is not accelerated within the channel and the disturbing phenomenon is prevented. As for memory cells B and D, since the word lines WL12, WL22 are also both at 0 V, a writing operation is not executed.

FIG. 10 shows a case of charge injection into the charge accumulative layer indicated by the small circle mark by application of a ninth voltage of 6 V to the word line WL21 in memory cell A. In FIG. 9, inverting the bias relation of word lines WL11, WL21 applies a tenth voltage of 3 V to word line WL11 as the other control gate, and a ninth voltage of 6 V is applied to word line WL21 as one control gate. Further inverting the bias relation of distribution lines L1, L2 applies a seventh voltage of 0V to the distribution line L1 connected to the other diffusion layer, and an eleventh voltage of 3 V is applied to the distribution line L2 connected to the diffusion layer adjacent to the charge accumulative layer indicated by the small circle mark. To prevent the disturbing phenomenon of memory cell C connected to the word lines WL11, WL21, 0 V is applied to both distribution lines L3, L4 as in the case of FIG. 9. In the case of FIG. 10, an auxiliary transistor is composed of word line WL21 connected to one control gate layer on the charge accumulative layer indicated by the small control gate layer on the charge accumulative layer indicated by the small circle mark and the other control gate layer connected to the word line WL11, and charges are injected from the distribution line L1. Other actions and effects are the same as in FIG. 9, and further description is omitted.

In the writing operation in the second multi-value storage operation, by applying a writing voltage (6 V) as a ninth voltage to one control gate layer on the charge accumulative layer as the object of injecting charges, a tenth voltage similar to a reading voltage is applied to the other control gate layer adjacent in the channel length direction, thereby forming a channel in the channel region. The other control gate layer is an auxiliary transistor. The charge entered from the diffusion layer adjacent to the auxiliary transistor is accelerated along the channel of the auxiliary transistor and reaches beneath the charge accumulative layer as the object of writing. Then, the charge is a hot electron of high energy state and is injected into the charge accumulative layer by the hot electron phenomenon. To inject charges into the charge accumulative layer beneath each control gate layer, the other control gate layer is used as an auxiliary transistor to play the role of accelerating the charge. The charge input direction must be changed depending on the position of a charge accumulative layer for accumulating charges. Data can then be stored in each control gate layer. Data can also be stored at each word line, so that one memory cell having two control gate layers has two addresses and can store two-bit data.

FIGS. 11 and 12 refer to a reading operation in accordance with the present invention. The diagrams show the content of memory cell A after the writing operation in FIG. 9 and FIG. 10, respectively. In the second multi-value storage operation, the bias relation of distribution lines must be inverted between the reading operation and the writing operation. That is, a reverse read operation is needed. This is because, during the reading operation, the diffusion layer adjacent to the charge accumulative layer of the object of reading must be the source terminal side to which 0 V is applied. Since the gate bias varies depending on the presence or absence of charge in the charge accumulative layer, the change of channel current is greater when the gate bias is changed at the source terminal side, thereby enhancing the sensitivity of a presence or absence of an accumulation of charge. In the case of the reading operation, a seventh voltage of 0 V is applied to the distribution line adjacent to one diffusion layer adjacent to the charge accumulative layer of the object of reading and an eighth voltage of 1.5 V is applied to the distribution line connected to the other diffusion layer. In the two word lines, a sixth voltage, a reading voltage of 3 V, is commonly applied and the reading operation is executed depending on the presence or absence of current flowing between the diffusion layers.

FIG. 11 depicts a case of injection and accumulation of charges in the charge accumulative layer beneath the control gate layer connected to the word line WL11. In memory cell A, the charge accumulative layer at the distribution line L1 side is the object of reading. A voltage of 0 V is applied to distribution line L1 and 1.5 V is applied to distribution line L2. A voltage of 3 V is applied commonly to word lines WL11, WL21. When charges are accumulated in the charge accumulative layer of the object of reading, at the distribution line L1 side, a potential lowered from 3 V due to accumulation of charges faces towards the channel region, and a voltage lower than 3 V is applied between the gate and source, thereby flowing a smaller current as a second current in the channel similar to FIG. 7. When charges are further accumulated in the adjacent charge accumulative layer, an even smaller current flows as a third current, as in FIG. 8, or a channel is not formed in the channel region, and no current flows. If no charge is accumulated in the charge accumulative layer of the object of reading, at the distribution line L1 side, the 3 V potential faces towards the channel region, and 3 V is applied between the gate and source, applying a sufficient gate bias. A fourth current, a large current larger than the second current in FIG. 2, flows in the channel. If no charge is accumulated in the charge accumulative layer of the object of reading, and charge is accumulated in the adjacent charge accumulative layer, as mentioned in FIG. 6, a first current, which is larger than the second current in FIG. 7 and smaller than the fourth current, flows.

FIG. 12 is a case of injection and accumulation of charges in the charge accumulative layer beneath the control gate layer connected to the word line WL21. As compared with the case of FIG. 11, the bias relation of the distribution lines L1, L2 is inverted. A voltage of 1.5 V is applied to distribution line L1, and 0 V to distribution line L2. A voltage of 3 V is applied commonly to word lines WL11, WL21. Actions and effects of reading are the same as in FIG. 11, and further description is omitted.

In the reading operation generally, a fifth voltage of 0 V is applied to the substrate.

During the reading operation in a second multi-value storage operation, in a pair of diffusion layers in the memory cell, the diffusion layer adjacent to the charge accumulative layer of the object of reading is used as a source terminal. In this case, 0 V is applied to the diffusion layer as the source terminal. However, this diffusion layer is the opposite side of the diffusion layer provided with 0 V during writing operation, so a reverse reading operation is carried out. The gate bias changes depending on the presence or absence of charge in the charge accumulative layer of the object of reading and the presence and absence of a channel in the channel region is inverted. If there is an accumulation of charges, the current is small, or a channel is not formed and current does not flow. If there is no accumulation of charges, a channel is formed and a large current flows. As a result, each bit is read out in every control gate by selecting the charge accumulative layer.

FIGS. 13 and 14 refer to an erasing operation. FIG. 13 shows a case of erasing the memory cells in the chip or sector in a batch. This erasing operation is called chip erase or sector erase. It shows bias application in the case of channel erase for discharging the charges accumulated in the charge accumulative layer toward the substrate. For batch erasing of charge accumulative layers in memory cells A to D, the same bias is applied for all of the memory cells. The source lines SL1, SL2, and bit lines BL1, BL2 are set in a floating state by a thirteenth voltage, a twelfth voltage of 0 V is applied to the word lines WL11 to WL22, and a fourteenth voltage of 9 V is applied to the substrate.

FIG. 14 shows a case of batch erasing of memory cells sharing the same word line. This erasing operation is called page erase. It shows the bias application for source erasing by discharging the charges accumulated in the charge accumulative layer toward the adjacent diffusion layer. For batch erasing of charge accumulative layers at both sides of memory cells A, C, the same bias is applied to the memory cells. A fifth voltage of 0 V is applied to the substrate, a seventeenth voltage of 9 V is applied to distribution lines L1 to L4, and a fifteenth voltage of 0 V is applied to the word lines WL11, WL21. In memory cells B, D which are not to be erased, by applying 6 V to the word lines WL12, WL22, the electric field is limited between the word line and diffusion layer and the word line and substrate, and bias is applied, so as to prevent the erasing operation thereof.

The page erasing method is not limited to this method, and, although not shown in FIG. 23, the charges accumulated in the charge accumulative layer of an arbitrary word line can be discharged toward the substrate, which is known as channel erase. A twelfth voltage of 0 V is applied to a word line for page erase, a sixteenth voltage of 6 V is applied to a word line not to be page-erased, and a fourteenth voltage of 9 V is applied to the substrate.

When erasing the charge accumulative layers at one side of memory cells A, C, (i.e., only the charge accumulative layer beneath the word line WL11) a fifteenth voltage of 0 V is applied to word line WL11 and a sixteenth voltage of 6 V is applied to the word line WL21, and therefore the electric field is limited between the word line WL21 and diffusion layer and the word line WL21 and substrate, applying bias so as to prevent the erasing operation on the charge accumulative layer beneath the word line WL21. Of the memory cells sharing the word line, by applying 0 V to the distribution line of the memory cell not to be erased, the erasing operation can be executed in bit units.

In the case of batch erasing of memory cells in the chip or sector, similarly, erasing in page units is possible by applying 6V to the word line not to be erased.

In the erasing operation in accordance with the present invention explained so far, it is possible to erase in block units, in a batch or chip erase, or in bit units and a high speed erasing operation is advantageously provided and beneficial effects are brought about.

Figure 17:
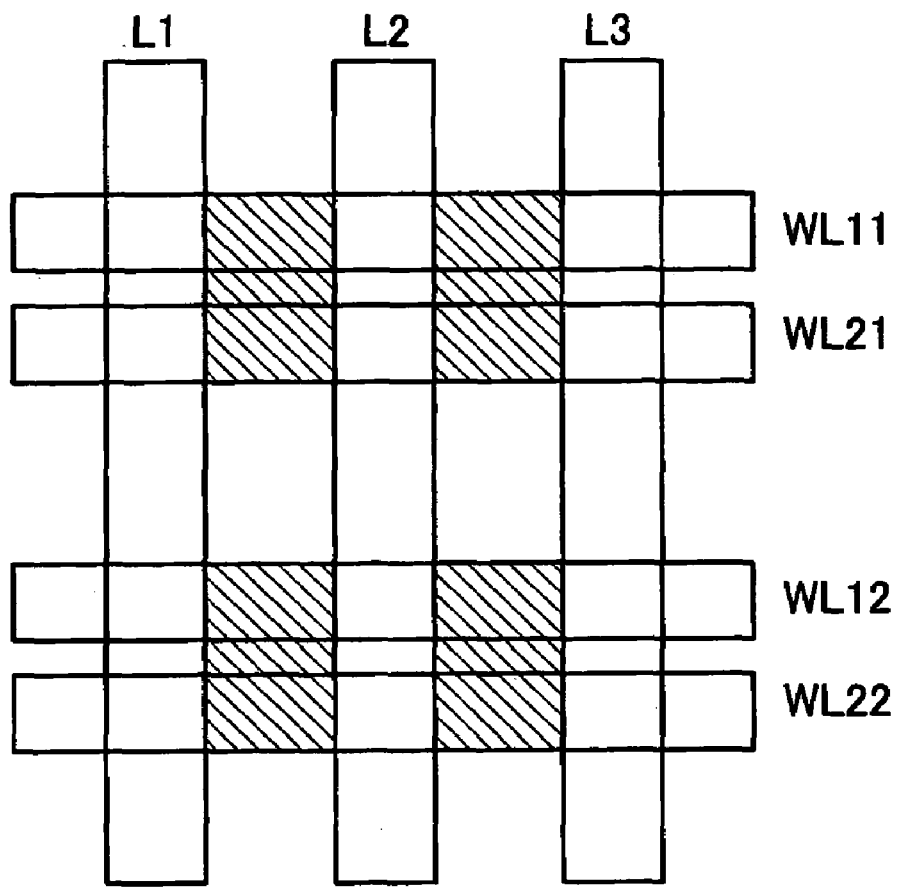
FIG. 17 is a layout diagram of parallel wiring of control gate layers in the channel direction in a memory cell in accordance with an embodiment of the present invention.

FIGS. 15 to 17 are layout diagrams of diffusion layers and word lines. The control gate layer can be shared between memory cells adjacent in a row direction and the word lines can be used as control lines. The shaded area in the diagram shows the channel region of the memory cell enclosed by the pair of diffusion layers.

FIG. 15 is a layout diagram of a NAND type flash memory in accordance with the present invention. Diffusion layers D11, D22 are disposed alternately with channel regions, and two layers intersect with a pair of word lines (WL11 and WL21, WL12 and WL22, etc.). A memory cell is composed of a pair of word lines, and source terminal S and drain terminal D at both sides, and the memory cells are connected in series. At both ends of diffusion layers D12, 22, diffusion layers D11, D21, and diffusion layers D13, D23 are connected. A contact SL for connection with the source line is formed in diffusion layers D11, D21, and contacts BL1, BL2 for connection with bit lines are formed in diffusion layers D13, D23. A pair of word lines (WL11 and WL21, WL12 and WL22, etc.) are disposed adjacently and parallel to each other. In the memory cell group connected to the same bit line, different word line pairs are connected in each memory cell.

FIG. 16 is a layout diagram of a NOR type flash memory in accordance with the present invention. Diffusion layers D1, D2 are disposed alternately with channel regions, and two layers intersect with a pair of word lines (WL11 and WL21, WL12 and WL22, etc.). Between a pair of word lines, contacts L1, L2, and L3, L4 for connection with distribution lines are formed alternately. Alternately formed contacts are connected to the distribution lines in each contact. A memory cell is composed of a pair of word lines with contacts at both sides. A pair of word lines (WL11 and WL21, WL12 and WL22, etc.) are disposed adjacently and parallel to each other. In the memory cell group connected to the same bit line, different word line pairs are connected in each memory cell.

A pair of word lines are disposed adjacently and parallel to each other, and intersect with the diffusion layers composing the memory cell group connected to the same bit line or the same distribution line. Hence the memory cell to be selected by a pair of word lines in each memory cell group is limited to only one. Therefore, the non-selected memory cells are not biased at the same time, and there is no risk of occurrence of wrong reading from a non-selected memory cell, or the disturbing phenomenon of a non-selected memory cell or the like.

As shown in FIG. 17, if a pair of word lines disposed adjacently and parallel to each other intersect with diffusion layers, memory cells may be formed parallel to the wiring direction of word lines. That is, word lines WL11 to WL22 are wired orthogonally to distribution lines L1 to L3. In channel regions between adjacent distribution lines L1 and L2, or L2 and L3, the control gate layer forms a rectangular region for linking the adjacent distribution lines along the channel length direction, thereby forming in one row so as to divide the channel width. A memory cell is composed of a pair of adjacent distribution lines and a pair of control gate layers between the distribution lines. Beneath each one of two control gate layers disposed in the channel length direction, the presence or absence of charge in the charge accumulative layer is limited and formation of a channel route is controlled. As a route for each channel current, it may form two channel routes for reading, one route only, or no route. The current amount when reading is variable and multi-value storage is realized. In this case, using the distribution lines L1 to L3 as diffusion layers (defined embedded diffusion layers) to be shared by plural memory cells connected in a direction orthogonal to the word line, they can be distributed as source/bit lines.

Figure 18:
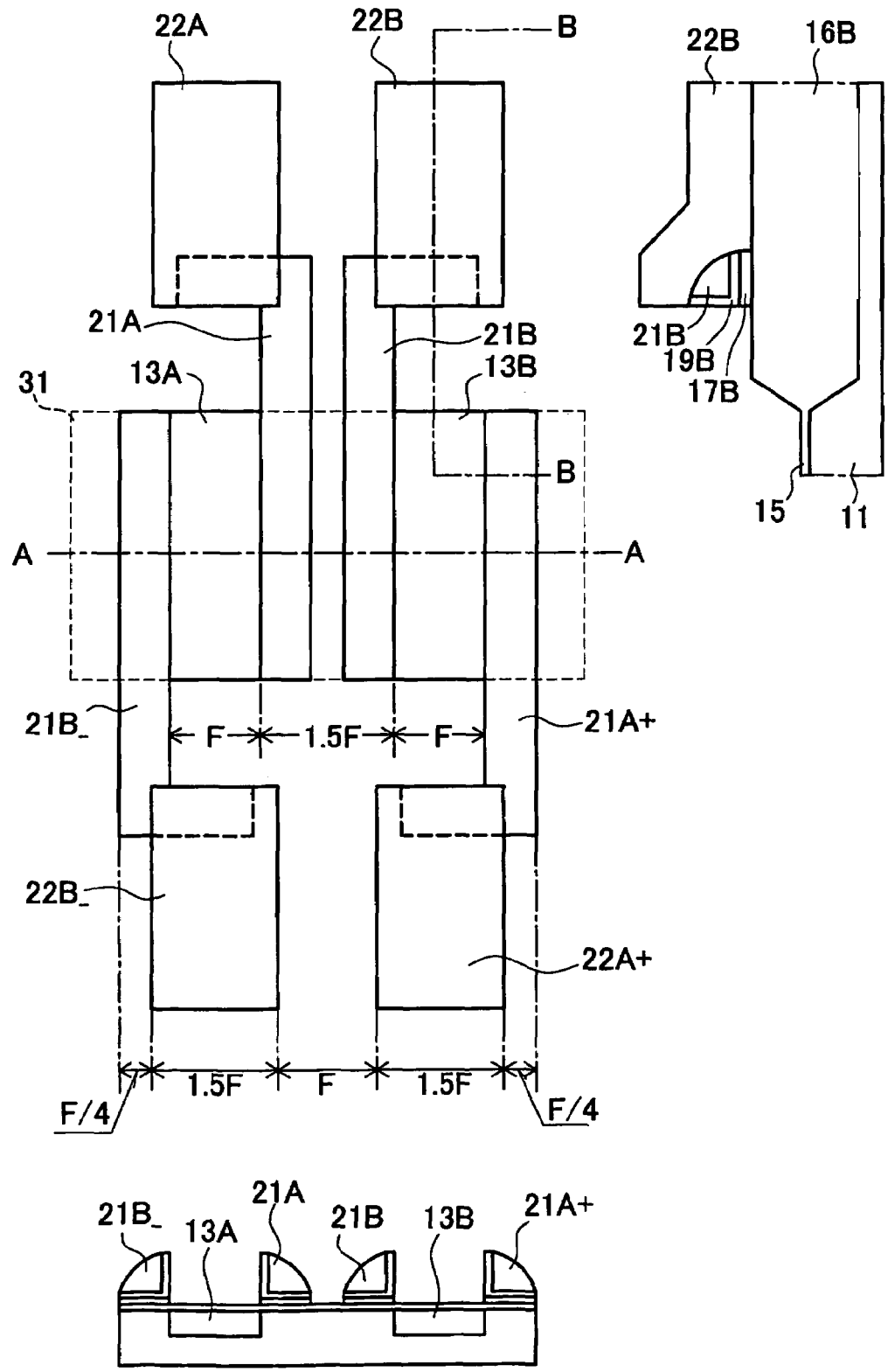
FIG. 18 is a plane and cross sectional view of a memory cell in accordance with an embodiment of the present invention.
Figure 20F:
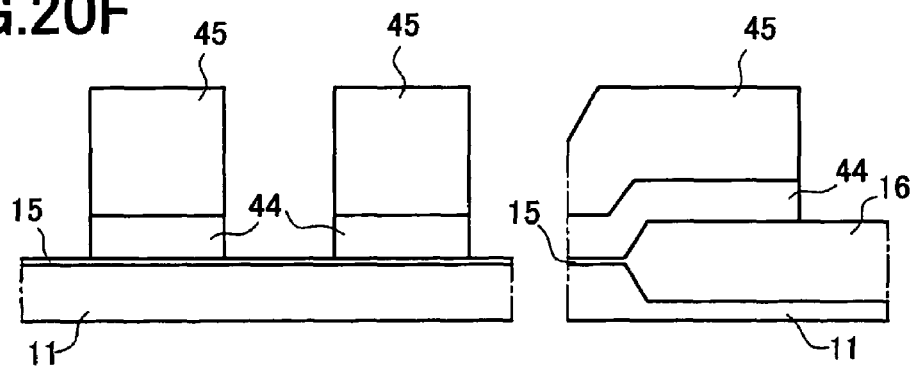
FIGS. 20F to 20I are a second set of cross sectional views of a manufacturing process of the memory cell in FIG. 18 (from deposition of mask layer to anisotropic etching) in accordance with the present invention.
Figure 20G:
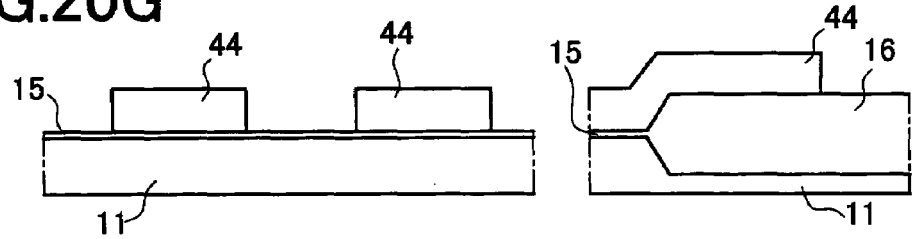
Figure 20H:
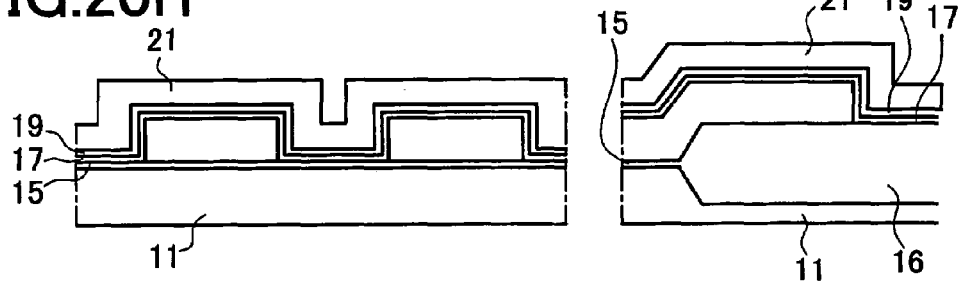
Figure 20I:
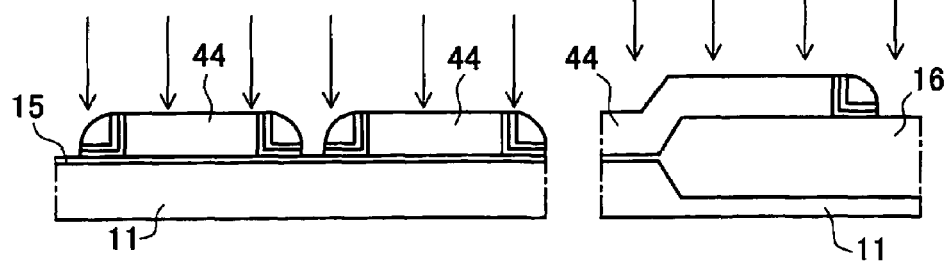
Figure 21:
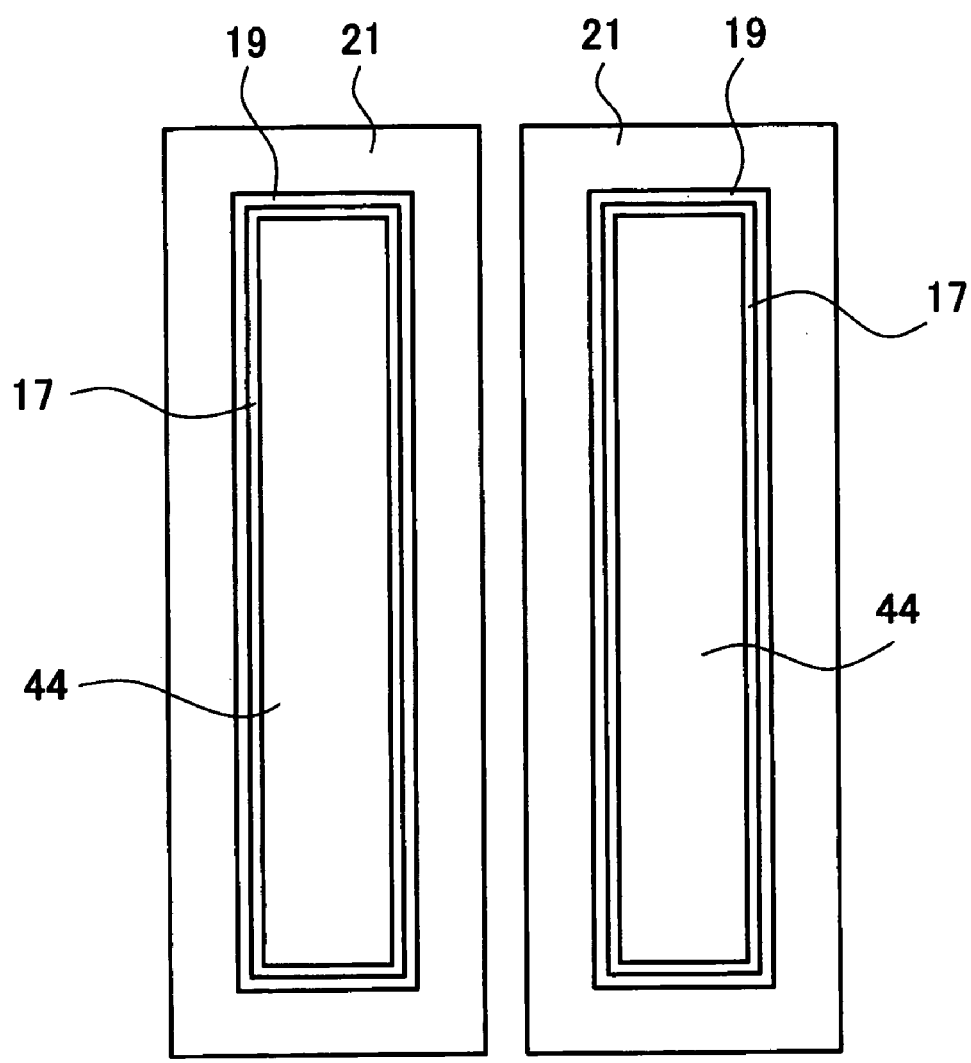
FIG. 21 is a plane structure diagram of a memory cell at the finishing point of the manufacturing process of FIGS. 19 and 20.

FIG. 18 shows a plane structure of a memory cell in accordance with an embodiment of the present invention, and AA and BB cross sectional structures, and FIGS. 19 to 21 show its manufacturing process.

FIG. 18 is a layout diagram of a memory cell in accordance with the present invention. A transistor region 31 is a memory cell array composed of plural memory cells. Transistor region 31 is a region where a field oxide film 16B is not deposited, and it is a region where a pair of diffusion layers 13A, 13B for forming a memory cell are formed with a channel region between them. In a pair of diffusion layers 13A, 13B, at both ends in the AA direction, an ONO film and control gate layers 21A, 21B, 21B_, 21A+ to be formed thereon are disposed along the end sides. The control gate layers 21A, 21B disposed on the channel region enclosed by the confronting diffusion layers 13A, 13B are the control gate layers of the intended memory cell. The control gate layers 21A, 21B are extended in one direction surpassing the transistor region 31. The control gate layers 21B_, 21A+ disposed along the other side of the diffusion layers 13A, 13B are control gate layers of the adjacent memory cell not shown. In this case, the memory cell shares the diffusion layer and is disposed repeatedly in a multiplicity in the AA direction in FIG. 18. The control gate layers 21B_, 21A+ are extended in a reverse direction of control gate layers 21A, 21B, surpassing the transistor region 31.

The control gate layers 21A, 21B, 21B_, 21A+ are extended over the transistor region 31 and are bent to surround the diffusion layers 13A, 13B in the end portion of the memory cell array composed of a plurality of memory cells. In the bent portions, wiring distribution bases for connection with word lines are connected, that is, 22A, 22B, 22B_, 22A+. Supposing the minimum processing dimension to be F, the interval of the wiring distribution bases is F, the width of the wiring distribution base is 1.5F, and the margin from the end of the wiring distribution base to the end of the control gate layer is F/4.

In FIG. 18, an AA cross sectional view and a BB cross sectional view are also shown. In the AA cross sectional view, control gate layers 21A, 21B are constructed in a side wall structure having curved confronting sides. Beneath the control gate layers 21A, 21B, an ONO film is stacked up by laminating the first insulating layer 15, the charge accumulative layer 17, and the second insulating layer 19. The first insulating layer 15 is also formed on the diffusion layers 13A, 13B.

In the BB cross sectional view, a field oxide film 16B is formed outside of the transistor region 31. A wiring distribution base 22B is laminated on the extended and bent portion of the control gate film 21B and an ONO film is laminated on the channel region in the memory cell. Since the control gate layer 21B and the wiring distribution base 22B are made of materials of the same composition by laminating, an ohmic contact is achieved.

An outline of the manufacturing process of the memory cell of FIG. 18 in accordance with an embodiment of the present invention is shown In FIGS. 19-21. In FIG. 19A, after stacking up oxide film 41 and nitride film 43 on the substrate 11, the nitride film 43 in the region other than the transistor region 31 is removed. The remaining nitride film 43 is used as a mask, and a field oxide film 16 is formed on the substrate (FIG. 19B). As a result, elements are separated on the substrate surface. After removing nitride film 43 and oxide film 41 (FIG. 19C), a gate oxide film (the first insulating layer) 15 is formed on the entire surface by hot oxidation (FIG. 19D), and a nitride film 44 is further stacked up (FIG. 19E). The nitride film 44 is a mask layer for anisotropic etching when forming a side wall structure of the control gate layer 21 on the channel region.

In FIG. 20, resist 45 applied on the nitride film 44 is exposed and removed; the resist 45 is left over in the portion for forming the diffusion layers and the portion for drawing out the control gate layers, and, using the resist 45 as mask, the nitride film 44 is etched (FIG. 20F). The width of the channel region between the diffusion layers is 1.5F. The width of the diffusion layer is F. Herein, the portion for drawing out the control gate layers is a portion extended in the wiring direction of the word line by surpassing the transistor region 31. The nitride film 44 is extended and to the transistor region 31 for forming the diffusion layers and its outside, that is, the region of forming the field oxide film.

After the removal of resist 45 (FIG. 20G), the upper two layers of the ONO film are sequentially laminated on the entire surface. That is, a nitride film (the charge accumulative layer) 17 and an oxide film (the second insulating film) 19 are stacked up. Further, a conductive material film (the control gate layer) 21 of a polycrystalline silicon layer or the like is stacked up for composing a control gate layer (FIG. 20H).

Further, by anisotropic etching, the conductive material film (the control gate layer) 21, and an upper two layers of ONO film (an oxide film (the second insulating film) 19 and a nitride film (charge accumulative layer) 17) stacked up on the end face of the substrate are etched (FIG. 20I). As a result, the upper two layers of ONO film and the control gate layer 21 laminated on the side wall of the nitride film 44 used as a mask layer can be formed as a side wall structure. The side wall structure is formed facing to the portion of the channel region in the transistor region 31 and is similarly formed on the side wall of the nitride film 44 outside of the transistor region 31.

FIG. 21 is a plan view after the processing in accordance with FIGS. 19 and 20 (FIG. 20I). On the outer side wall of the nitride film 44 used as a mask layer, the charge accumulative layer 17, the second insulating layer 19, and the control gate layer 21 are formed in a side wall structure.

Figure 22:
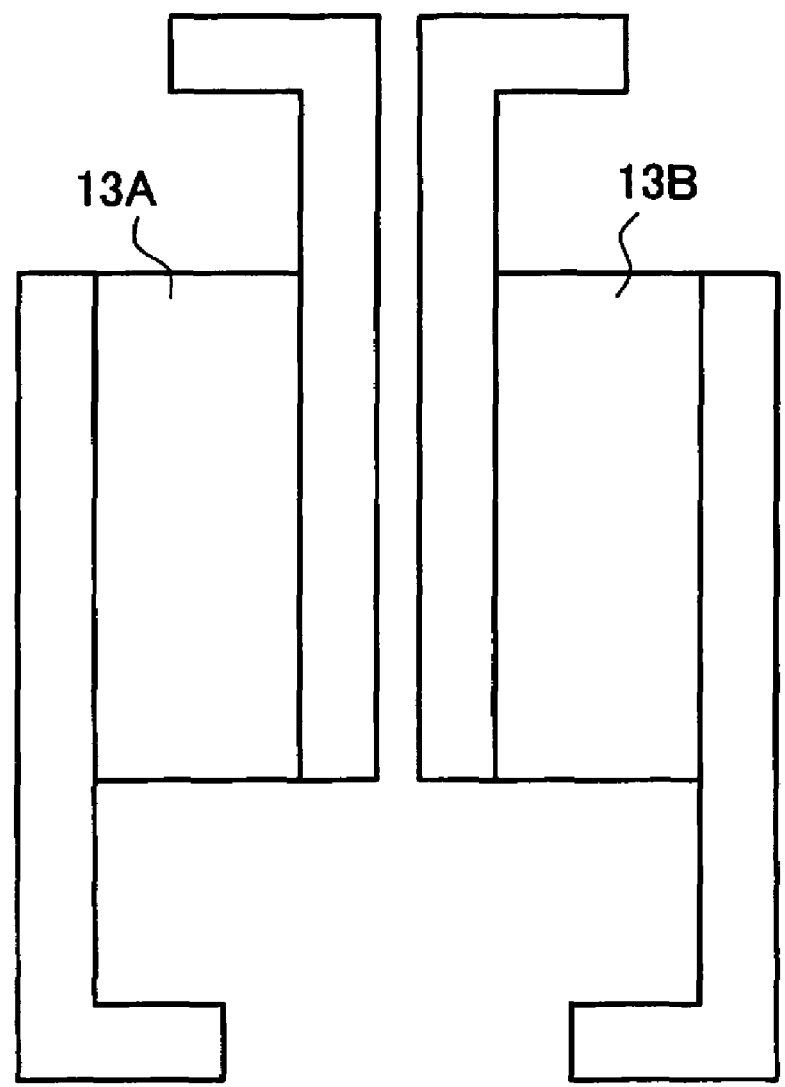
FIG. 22 is a plane structure diagram of a memory cell showing the configuration of control gate layers and wiring distribution base in accordance with the present invention.

As shown in FIG. 22, by removing the nitride film 44, diffusion layers 13A, 13B are formed by ion implantation or the like, and the side wall structure surrounding the outer periphery of the nitride film 44 is separated from the right and left ends of the diffusion layers 13A, 13B, and control gate layers 21A, 21B, 21B_, 21A+ are formed. At this time, each control gate layer is separated outside of the transistor region 31 and the end portions of separated control gate layers 21A, 21B, 21B_, 21A+ are preferred to be formed surrounding the diffusion layers 13A, 13B. As a result, the control gate layers 21A, 21B, 21B_21A+ having side wall structure outside of the transistor region 31 are formed outward, and the control gate layers 21A, 21B, 21B_21A+ can be connected securely with wiring distribution bases 22A, 22B_, 22B+, 22A+ when drawn out as word lines.

As is clear from the explanation herein, in accordance with the embodiment of the present invention, charges can be injected and/or discharged in the inherent charge accumulative regions (FIG. 1) in each one of the control gate layers 21A, 21B of the charge accumulative layer 17, or in the individually provided charge accumulative layers 17A, 17B (FIG. 2). Hence, the data can be stored by the number corresponding to the combination of the presence or absence of charges in the inherent region of the charge accumulative layer 17, or the individual charge accumulative layers 17A, 17B. That is, in the memory cell having two control gate layers 21A, 21B, two-bit data can be stored. By selecting the control gate layers 21A, 21B for injecting and/or discharging the charges, first multi-value storage operation for storing data of specified bits can be executed.

Moreover, by accumulating charges in each one of the control gate layers 21A, 21B, one-bit data can be stored depending on the presence or absence of charge in the inherent region of the charge accumulative layer 17 beneath control gate layers 21A, 21B (FIG. 1), or the individual charge accumulative layers 17A, 17B (FIG. 2). When writing, by applying an auxiliary voltage to the other control gate layer, the inputted charge can be accelerated.

In the memory cell having two control gate layers 21A, 21B, by selecting different addresses in individual control gate layers 21A, 21B, one-bit data can be stored in the control gate layers 21A, 21B individually. In one memory cell identified by two addresses, two pieces of one-bit data can be stored, that is, a second multi-value storage operation is realized.

In accordance with the present invention, it is not required to change the writing voltage to be applied to the control gate layers 21A, 21B depending on the writing data value. Thus, multi-value storage can be realized by the present invention in one writing operation.

In the writing operation, the reading operation, and the erasing operation of a memory cell in accordance with an embodiment of the present invention, voltage conditions applied to each electrode of memory cell transistors by the known principal methods are summarized in FIG. 23. A first voltage to a seventeenth voltage are examples of voltages applied to electrodes of the memory cell transistors during the writing operation, the reading operation, and the erasing operation.

The invention is not limited to the embodiments described herein, but may be changed and modified within the scope of the invention as claimed in the claims appended hereto.

For example, the memory cell of the described embodiment has two control gate layers, but the invention is not limited to this number. For example, the memory cell may have three or more control gate layers.

In this case, in a first multi-value storage operation, control gate layers must be arranged in one row along the channel length direction or channel width direction, on the channel region enclosed by diffusion layers in the memory cell. As the region of the charge accumulative layer accumulating charges depending on bias application to the control gate layer changes along the channel length direction or channel width direction on the channel region, the current amount in the reading operation must be changed. Further, when writing in the first multi-value storage operation, for example, having three control gate layers, any one control gate layer of the object of writing is supposed to be one control gate, and a first voltage is applied, and two other control gate layers not the object of writing are other control gates, and hence a fifth voltage lower than the first voltage is applied to both of them.

In the case of a second multi-value storage action, a set is composed of two control gate layers, and multiple sets are formed along the channel length direction. In each set, either control gate layer is used as an auxiliary gate, and while accelerating the charge, depending on the writing voltage to the other control gate layer, charges can be injected into the charge accumulative layer beneath the other control gate layer.

In the embodiments described herein, concerning the writing operation and the erasing operation, charges are injected into or discharged from the charge accumulative layer, but the invention is not limited to this operation alone. Writing or erasing is also possible by injecting hot holes into the charge accumulative layer. Further, between the charge accumulative layer and the diffusion layer, writing by between-band tunneling current is also possible.

Figure 24:
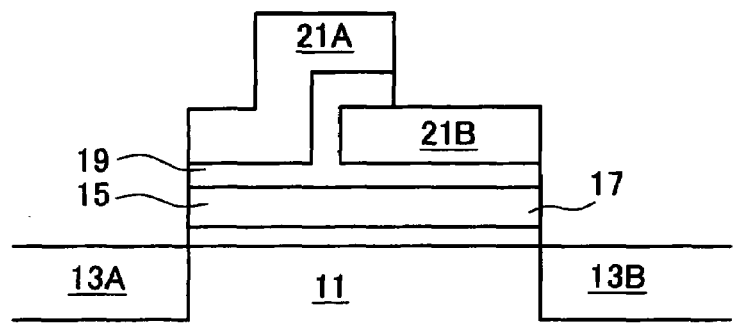
FIG. 24 is a cross sectional view of the structure of a memory cell in a nonvolatile memory device in accordance with an alternate embodiment of the present invention.
Figure 25:
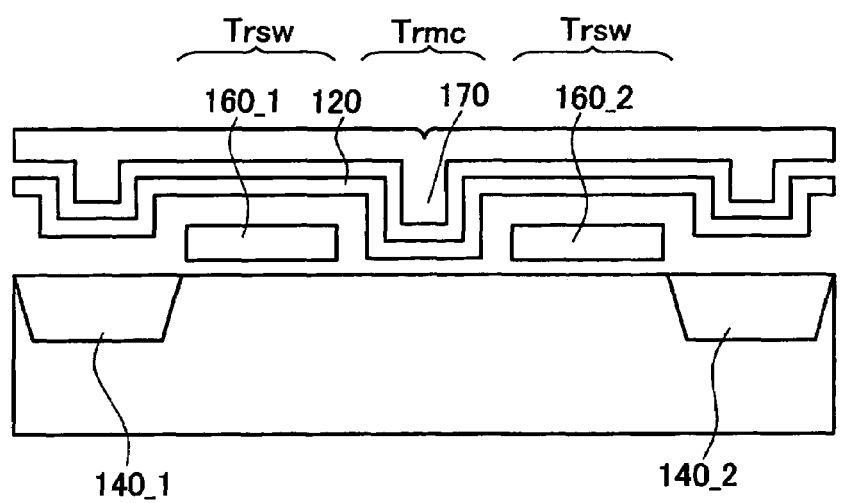
FIG. 25 is a cross sectional view of a memory cell in accordance with patent document 1.
Figure 26:
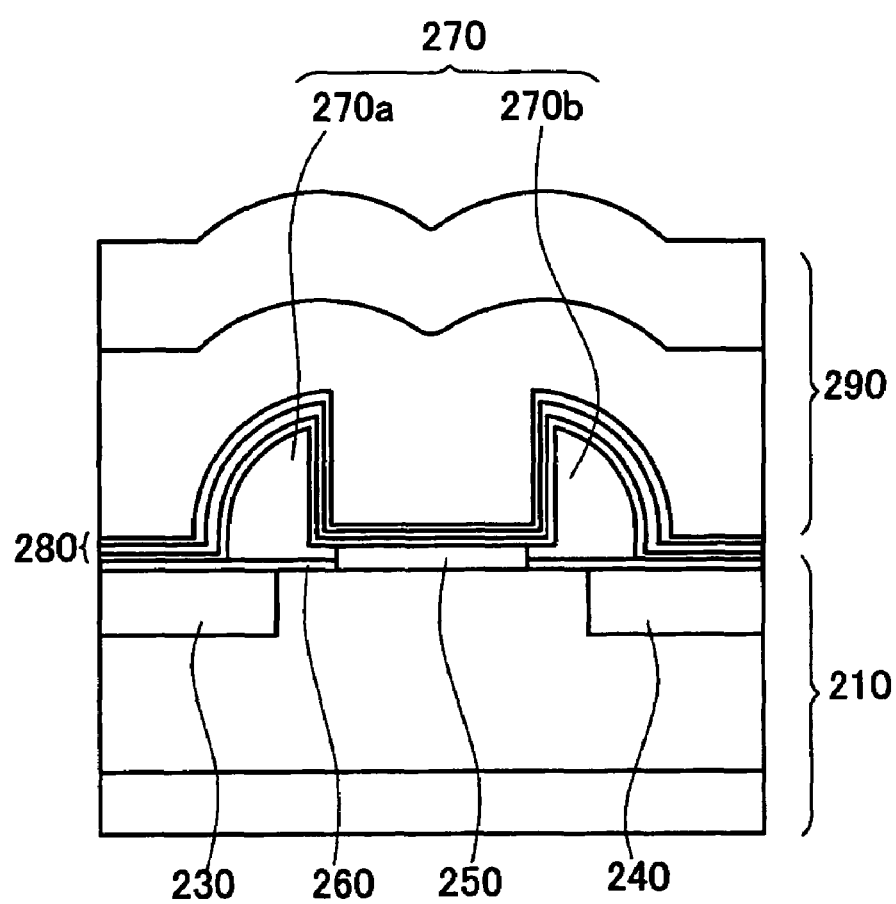
FIG. 26 is a cross sectional view of a memory cell in accordance with patent document 2.

The structure of FIG. 1 may further be extended, and the cell size can be reduced. A cross sectional view in FIG. 24 shows a structure of an expanded type of memory cell provided in a nonvolatile storage device in accordance with an alternate embodiment of the present invention. According to this structure, on a channel region enclosed by the diffusion layers 13A, 13B, the first insulating layer 15, the charge accumulative layer 17, and the second insulating layer 19 are stacked up in this order, and the two control gate layers 21A, 21B are disposed on the second insulating layer 19 in the channel length direction so as to be spaced from each other and partly overlap each other.

A feature of this structure is similar to the structure in FIG. 1 in that the charge accumulative layer 17 has discrete charge traps, but differs in that the two control gate layers 21A, 21B overlap in part, and an insulating layer is disposed in the partly overlapping portion.

As a result, the gap G1 in the structure of FIG. 1 can be eliminated, and, by overlapping in part, the gap 1.5F of the pair of diffusion layers 13A, 13B can be substantially narrowed. Not only the cell size can be reduced, but also the channel resistance can be decreased and electrical characteristics in writing operation and reading operation can advantageously be enhanced.

What is claimed is:

1. A non-volatile memory device with memory cells, wherein each of the memory cells comprises:
    a pair of diffusion layers arranged on a substrate surface and separated by a channel region having a predetermined length;
    a plurality of control gate layers each of which is formed discretely over the channel region and separated from one another by a gap defined by mutually facing curved surface sidewalls; and
    at least one charge accumulative layer formed between the plurality of control gate layers and the substrate surface, the at least one charge accumulative layer having regions where charges are injected to and/or discharged from inherently for each of the plurality of control gate layers,
    wherein the at least one charge accumulative layer is provided discretely for each of the plurality of control gate layers.

2. The non-volatile memory device in accordance with claim 1 further comprising a first insulative layer formed between the substrate surface and the at least one charge accumulative layer, and/or a second insulative layer formed between the at least one charge accumulative layer and the plurality of control gate layers.

3. The non-volatile memory device in accordance with claim 1, wherein the at least one charge accumulative layer has discrete charge traps and the regions where charges are injected to and/or discharged from are partitioned.

4. The non-volatile memory device in accordance with claim 1, wherein the at least one charge accumulative layer is made of an insulative material.

5. The non-volatile memory device in accordance with claim 1, wherein each of a predetermined number of the memory cells is connected to a bit line in common, and a plurality of control lines connected to the control gate layers of each of the plurality of memory cells are connected to each of the predetermined number of memory cells in a manner of individual wiring among the predetermined number of the memory cells.

6. The non-volatile memory device in accordance with claim 1, wherein the control gate layers of the memory cells comprise a plurality of control lines shared by the memory cells and arranged continuously in a direction intersecting each bit line connected to one of the pair of diffusion layers coupled to each of the memory cells.

7. The non-volatile memory device in accordance with claim 5, wherein the plurality of control lines are arranged continuously in a direction that intersects the bit line and are wired in parallel, adjacent to one another.

8. The non-volatile memory device in accordance with claim 1, wherein a first voltage applied to the control gate layers performs injection and/or discharge of charges at the at least one charge accumulative layers, the at least one charge accumulative layers having regions where charges are injected to and/or discharged from inherently for each of the plurality of control gate layers.

9. The non-volatile memory device in accordance with claim 8, wherein a number of data bits to be stored in each of the memory cells is determined in response to a number of combinations of presence and absence of charges at each of the regions.

10. The non-volatile memory device in accordance with claim 8, wherein a data readout operation from each of the memory cells is conducted in response to a current value flowing between the pair of diffusion layers on condition that a read voltage is applied to the plurality of control gate layers.

11. The non-volatile memory device in accordance with claim 1,
    wherein the plurality of control gate layers are arranged with at least one pair of the plurality of control gate layers dividing the substrate surface into two in a channel route direction between the pair of diffusion layers, and different addresses for each of the plurality of control gate layers are allocated to the plurality of control gate layers, and
    wherein a first write voltage applied to one of the plurality of control gate layers selected by the different addresses performs injection and/or discharge of charges for data write operation at the regions beneath the one of the plurality of control gate layers.

12. The non-volatile memory device in accordance with claim 11, wherein, in each of the memory cells, one-bit data is stored by each of the plurality of control gate layers depending on presence or absence of charges at the at least one charge accumulative layer provided for each of the plurality of control gate layers.

13. The non-volatile memory device in accordance with claim 11, wherein a second write voltage which is lower than the first write voltage is applied to the another one of the plurality of control gate layers paired with the selected one of the plurality of control gate layers during a data write operation.

14. The non-volatile memory device in accordance with claim 11, wherein charges are injected from the diffusion layer adjacent to another one of the plurality of control gate layers paired with the selected one of the plurality of control gate layers during a data write operation.

15. The non-volatile memory device in accordance with claim 13, wherein charges written during the data write operation are accelerated toward the selected one of the plurality of control gate layers in response to application of the second write voltage.

16. The non-volatile memory device in accordance with claim 11, wherein readout of data stored by each of the plurality of control gate layers is conducted by applying a read voltage to the at least one pair of the plurality of control gate layers on condition that the one of the pair of diffusion layers adjacent to the selected control gate layer is used as a source terminal.

17. The non-volatile memory device in accordance with claim 1, wherein charges injected to and/or discharged from the at least one charge accumulative layer are conducted for two or more of the memory cells at the same time.

18. The non-volatile memory device in accordance with claim 1, wherein charges are injected to and/or discharged from the at least one charge accumulative layer formed beneath some of the plurality of control gate layers in response to a condition that voltage levels of the some of the plurality of control gate layers and others of the plurality of control gate layers are set to a first voltage and a second voltage which is lower than the first voltage, respectively, and a voltage level of the substrate is set to a substrate voltage which is lower than the first voltage.

19. The non-volatile memory device in accordance with claim 1, wherein charges are injected to and/or discharged from each of the at least one charge accumulative layer formed beneath the plurality of control gate layers in response to a condition that voltage levels of the plurality of control gate layers are set to a first voltage and a voltage level of the substrate is set to a substrate voltage which is lower than the first voltage.

20. The non-volatile memory device in accordance with claim 1, wherein charges are injected to and/or discharged from the at least one charge accumulative layer formed beneath some of the plurality of control gate layers in response to a condition that voltage levels of the some of the plurality of control gate layers and others of the plurality of control gate layers are set to a first voltage and a second voltage which is lower than the first voltage, respectively, and voltage levels of one of the pair of diffusion layers adjacent to the some of the plurality of control gate layers and another one of the pair of diffusion layers adjacent to the others of the plurality of control gate layers are set to an third voltage and a fourth voltage which is lower than the third voltage, respectively.

21. The non-volatile memory device in accordance with claim 1, wherein a data readout operation is conducted in response to a quantity of current flowing between the pair of diffusion layers in response to a voltage level of the plurality of control gate layers being set to a control gate read voltage and voltage levels of one of the pair of diffusion layers and another one of the pair of diffusion layers are set to a first diffusion layer read voltage and a second diffusion layer read voltage which is lower than the first diffusion layer read voltage, respectively.

22. The non-volatile memory device in accordance with claim 1, wherein a readout operation is conducted in response to a quantity of current flowing between the pair of diffusion layers in response to a voltage level of the plurality of control gate layers being set to a control gate read voltage and voltage levels of one of the pair of diffusion layers adjacent to some of the plurality of control gate layers and another one of the pair of diffusion layers adjacent to others of the plurality of control gate layers are set to a first diffusion layer read voltage and a second diffusion layer read voltage which is lower than the first diffusion layer read voltage, respectively.

23. The non-volatile memory device in accordance with claim 1, wherein charges are injected to and/or discharged from each of the at least one charge accumulative layer beneath the plurality of control gate layers in response to voltage levels of the plurality of control gate layers being set to control gate layer voltage and a voltage level of the substrate being set to a substrate voltage which is lower than the control gate layer voltage, respectively.

24. The non-volatile memory device in accordance with claim 1, wherein charges are injected to and/or discharged from the at least one charge accumulative layer beneath selected some of the plurality of control gate layers in response to a voltage level of the selected some of the plurality of control gate layers and a non-selected plurality of control gate layers being set to a first voltage and a second voltage which is higher than the first voltage, respectively, and a voltage level of the pair of diffusion layers or the substrate is set to a third voltage which is higher than the first voltage.

25. The non-volatile memory device in accordance with claim 1, wherein charges are injected to and/or discharged from the at least one charge accumulative layer beneath the plurality of control gate layers in the memory cell to be selected in response to a voltage level of the plurality of control gate layers in the memory cell to be selected being set to a first voltage and a voltage level of the pair of diffusion layers or the substrate is set to a second voltage which is higher than the first voltage.

* * * * *